US010554015B1

(12) United States Patent
Tassev

(10) Patent No.: US 10,554,015 B1
(45) Date of Patent: Feb. 4, 2020

(54) GROWTH/FABRICATION OF ORGANIC-INORGANIC QUASI PHASE-MATCHING STRUCTURES FOR FREQUENCY CONVERSION DEVICES

(71) Applicant: Government of the United States, as represented by the Secretary of the Air Force, Wright-Patterson AFB, OH (US)

(72) Inventor: Vladimir Tassev, Beavercreek, OH (US)

(73) Assignee: United States of America as represented by the Secretary of the Air Force, Wright Patterson AFB, OH (US)

( * ) Notice: Subject to any disclaimer, the term of this patent is extended or adjusted under 35 U.S.C. 154(b) by 176 days.

(21) Appl. No.: 15/879,721

(22) Filed: Jan. 25, 2018

Related U.S. Application Data

(63) Continuation of application No. 15/350,369, filed on Nov. 14, 2016, now Pat. No. 9,960,568.

(51) Int. Cl.
*H01S 5/06* (2006.01)
*C30B 30/02* (2006.01)
*C30B 25/04* (2006.01)

(52) U.S. Cl.
CPC ............ *H01S 5/0604* (2013.01); *C30B 25/04* (2013.01); *C30B 30/02* (2013.01); *H01S 2304/00* (2013.01)

(58) Field of Classification Search
None
See application file for complete search history.

(56) References Cited

U.S. PATENT DOCUMENTS

| 5,036,220 A * | 7/1991 | Byer ................... G02F 1/3558 359/326 |
| 5,121,250 A * | 6/1992 | Shinozaki ............ G02F 1/3775 359/328 |
| 5,654,229 A * | 8/1997 | Leplingard .......... G02F 1/3558 117/106 |

OTHER PUBLICATIONS

Yu, Z. et al., Study of the epitaxial-lateral-overgrowth (ELO) process for GaN on sapphire, Journal of Crystal Growth, 1998, pp. 333-339, vol. 195, Elsevier.

(Continued)

*Primary Examiner* — Bo B Jang
(74) *Attorney, Agent, or Firm* — AFMCLO/JAZ; Timothy Barlow

(57) ABSTRACT

A method of making a quasi-phase-matching (QPM) structure comprising the steps of: applying a pattern to a substrate to define a plurality of growth regions and a plurality of voids; growing in a growth chamber a crystalline inorganic material on only the growth regions in the pattern, the crystalline inorganic material having a first polarity; applying an electric field within the growth chamber containing the patterned substrate with the crystalline inorganic material, wherein the electric field reaches throughout the growth chamber; and growing a crystalline organic material having a second polarity in the voids formed in the inorganic material under the influence of the electric field to influence the magnitude and the direction of the second polarity of the crystalline organic material, wherein the second polarity of the crystalline organic material is influenced to be different from the first polarity of the crystalline inorganic material in magnitude and/or direction.

12 Claims, 16 Drawing Sheets

(56) References Cited

OTHER PUBLICATIONS

Gil-Lafon, et al., Selective growth of GaAs by HVPE: keys for accurate control of the growth morphologies, Journal of Crystal Growth, 1998, pp. 482-496, vol. 222, Elsevier.

Jazbinsek, et al., Photonic Applications With the Organic Nonlinear Optical Crystal DAST, 2008, pp. 1298-1311, vol. 14, IEEE Journal of Selected Topics in Quantum Electronics.

Tassev, et al., Growth and study of nonlinear optical materials for frequency conversion devices with applications in defence and security, Proc. Of SPIE, 2014, vol. 9253.

Tomita, Fabrication and characterization of a quasi-phase-matched GaP optical device for terahertz-wave generation, optical Materials, 2009, pp. 323-328, Elsevier.

Kuzmenko, et al., Fabrication and testing of diamond-machined gratings in ZnSe, GaP, and bismuth germanate for the near infrared and visible, SPIE Advanced Optical and . . . , 2008.

Tassev, et al., Epitaxial growth of quasi-phase matched GaP for nonlinear applications: Systematic process improvements, Journal of Crystal Growth, 2012, pp. 72-77, vol. 352.

Ruiz, et al., Crystal Growth of DAST, Crystal Growth & Design, 2008, pp. 4173-4184, vol. 8.

Natarajan, et al., Crystal growth and structure of L-methionine L-methioninium hydrogen maleate—a new NLO material, 2008.

Schunemann, et al., All-epitaxial growth of orientation-patterned gallium phosphide (OPGaP), Lasers, Sources, and Related Photonic Devices Technical Digest, 2012, pp.

Pomeranz, et al., 1-Micrometer-pumped OPO based on orientation-patterned GaP, Nonlinear frequency generation and conversion: Materials, Devices and Applications, 2015.

Arivanandhan, et al., Direction Controlled Growth of Organic Single Crystals by Novel Growth Methods, INTECH, 2013, Chapter 4, pp. 89-117.

Tassev, et al., HVPE growth and characterization of GaP on different substrates and patterned templates for frequency conversion devices, Journal of the European Optical Socie.

Clays, K., Phase-Matched Second-Harmonic Generation in a Four-Layered Polymeric Waveguide, J. Opt. Soc. Am., vol. 11, No. 4, Apr. 1994.

\* cited by examiner

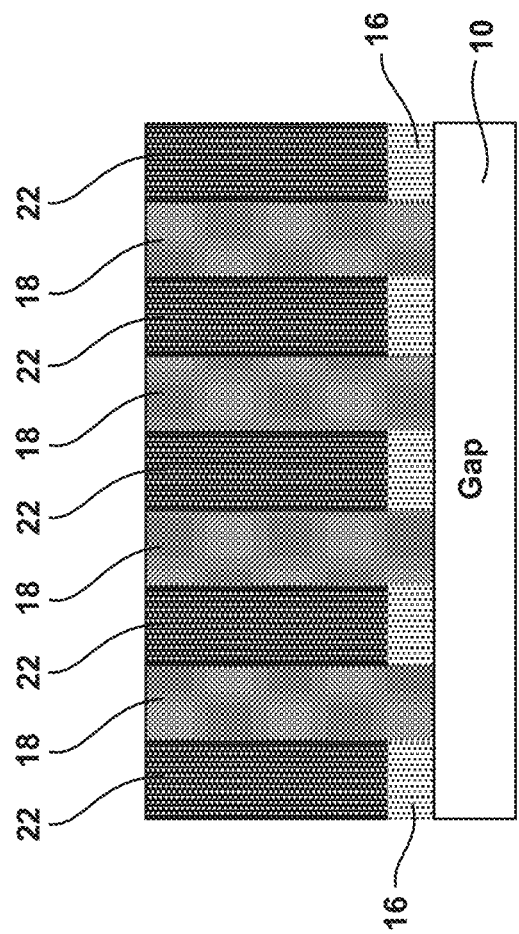

FIG. 3A
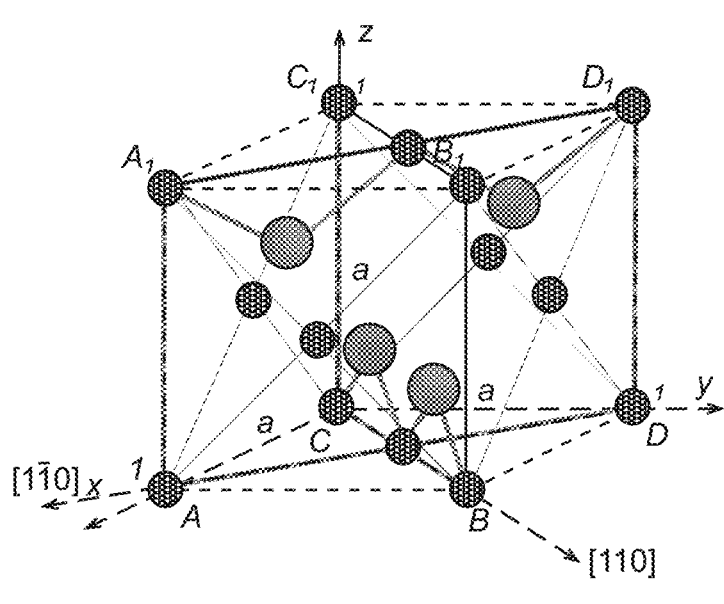
 Ga
P
FIG. 3B
FIG. 3C
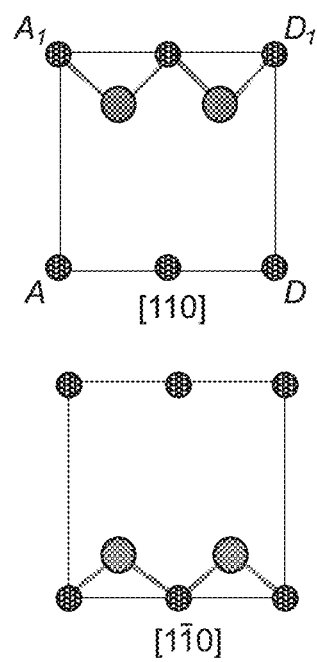

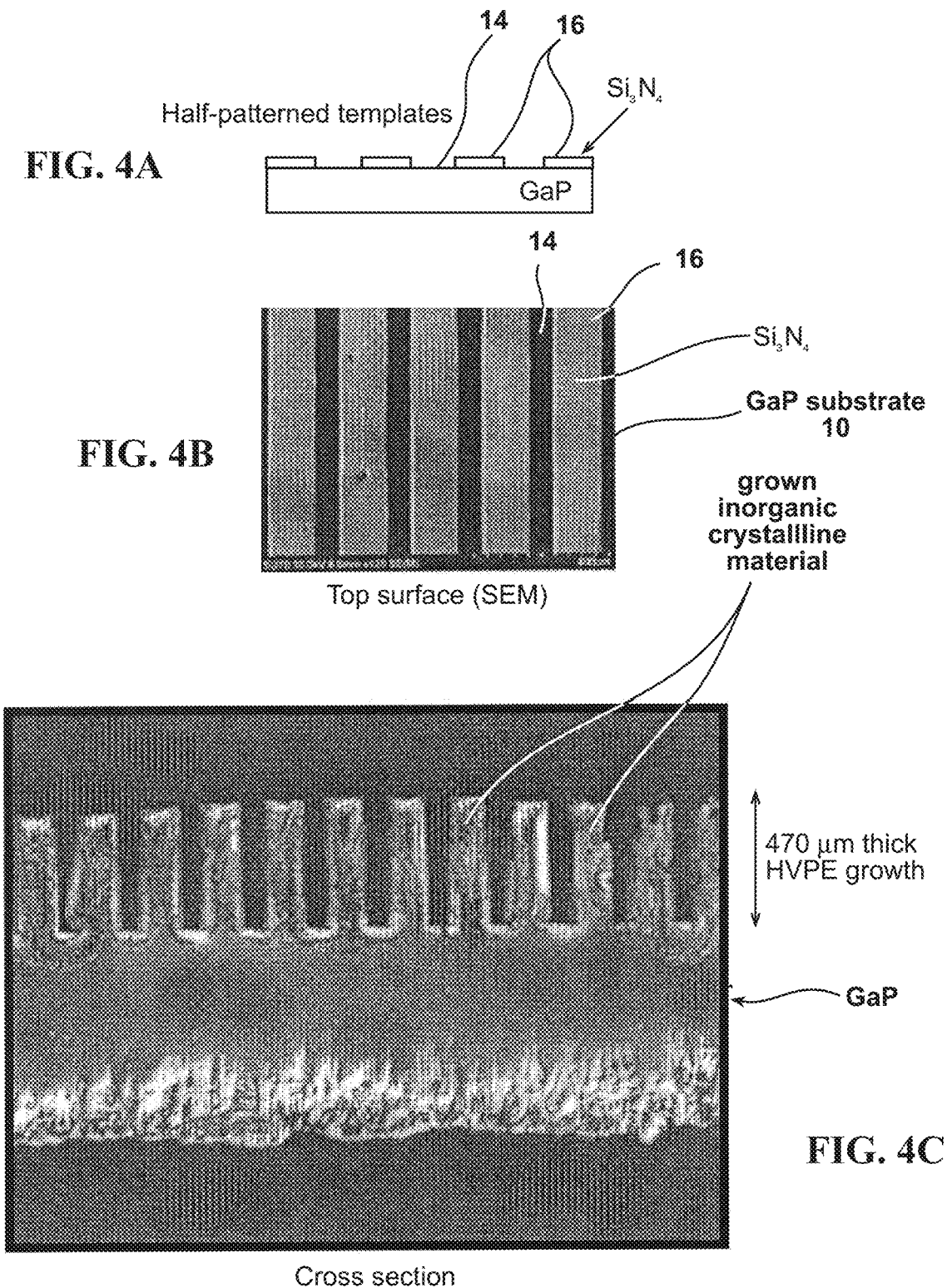

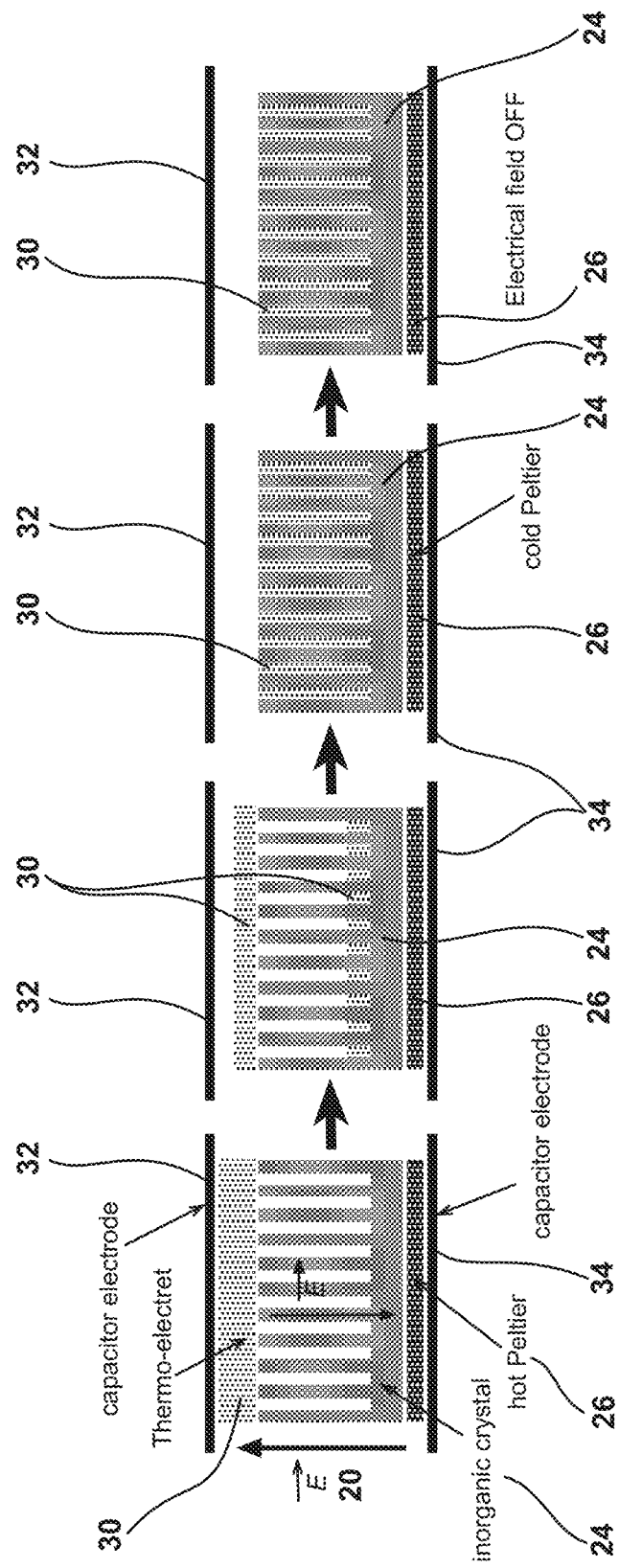

GROWTH/FABRICATION OF ORGANIC-INORGANIC QUASI PHASE-MATCHING STRUCTURES FOR FREQUENCY CONVERSION DEVICES

RIGHTS OF THE GOVERNMENT

The invention described herein may be manufactured and used by or for the Government of the United States for all governmental purposes without the payment of any royalty.

Pursuant to 37 C.F.R. § 1.78(a)(4), this application claims the benefit of and priority to prior filed Non-Provisional application Ser. No. 15/350,369, filed Nov. 14, 2016, which is expressly incorporated herein by reference.

FIELD OF THE INVENTION

The present invention relates generally to quasi-phase-matching structures and, more particularly, to the growth of organic-inorganic quasi-phase-matching structures which may be incorporated into frequency conversion devices.

BACKGROUND OF THE INVENTION

Coherent laser sources radiating in the mid- and longwave IR and THz wavelength ranges are in great demand due to their suitability for a wide variety of military and commercial applications, i.e., defense, security, science, industry, and medicine. However, such lasers are not commonly available, are large in size, need cooling for proper operation, and even then demonstrate small output power and are poorly tunable.

SUMMARY OF THE INVENTION

In contrast to the existing media, the disclosed invention combines the advantages of an inorganic wideband semiconductor and an organic crystalline material—both with high nonlinear susceptibilities and a broad range of transparency, including in the visible, IR and THz regions. By using homo- or heteroepitaxially grown semiconductor layers deposited on a half-patterned (HP) crystalline inorganic template in combination with an organic crystal material filling grown inside the inorganic matrix using various growth techniques, this invention eliminates the need to use orientation-patterned (OP) templates. The fabrication of such OP templates is a difficult, costly and time-consuming process. Thus, their replacement with HP templates, for which preparation is much easier and quite similar for many different materials is a significant step towards simplification of the whole process. In addition, this invention also eliminates the need of a subsequent thick epitaxial growth on the OP templates, which often requires years of effort to establish the optimal growth conditions each time when a new promising material is available for research. With respect to "optimal growth conditions" we specify such conditions of growth that ensure approximately equal growth rates (with a difference within the range of 5%) of the oppositely-oriented crystal domains in a growth process that minimizes parasitic nucleation on the surrounding parts and thus can ensure device-quality QPM structures that are hundreds of microns thick. Total elimination of the parasitic nucleation that take place upfront the substrate is difficult but it can be kept under 10% (expressed by the total mass of the parasitic nuclei) of the useful nucleation that occurs on the template surface. This makes it possible to grow crystalline HP QPM structures according to the present invention. The difficult growth on OP templates is eliminated in favor of the much easier growth on HP templates disclosed herein.

A long row of traditional III-V semiconductor nonlinear optical materials such as GaAs, GaP, ZnSe, ZnGeP2, GaN and AlN and some of their ternaries may be used in combination with several affordable IR-transparent and THz-transparent inorganic crystal materials with high nonlinear susceptibility, including in the IR and THz region, including such well-balanced molecules such as dimetil-amino-4'-N'methyl-stilbazolium Tosylate (DAST), 3-hydroxybenzaldehyde, benzophenone, etc. However, this invention is not restricted to the above- and below-mentioned materials, nor to any inorganic-organic combinations specified here below. For example, instead of organic crystals one can grow within the voids of the inorganic HP-matrix a so-called "semi-organic" material. The method disclosed herein may be applied to a number of material systems. New frequency ranges and, respectively, new practical realizations beyond those anticipated by the prior art may be achieved.

As a result, the development of the next-generation high power, high brightness, frequency-agile, room-temperature operating, compact coherent laser sources in the IR and THz spectral ranges is made possible. In another embodiment, the development of other spectral ranges, e.g. visible and UV, may be visibly accelerated. The price of the final product may be significantly reduced as well. Namely, the expected reduction of the coherent source component cost may make the next-generation infrared countermeasures (IRCMs) that can cover both atmospheric transmission windows (2-5 μm and 8-12 μm) more affordable, and may be used to provide protection to protect aircraft from existing and anticipated threats for smaller military aircraft and even for civilian aircraft. The cost advantage may make these systems viable for military and even civilian platforms.

The new sources may be suitable for a wide variety of other military, e.g., laser radar, high speed IR communications, in extreme environmental and atmospheric conditions, etc.; civil security, e.g., remote sensing of chemical and biological agents, scanners, etc.; and commercial, e.g., biopsy-free detection and visualization of cancer cells; environmental sensing; industrial production and spectroscopy applications.

The present invention overcomes the foregoing problems and other shortcomings, drawbacks, and challenges in making organic-inorganic quasi-phase-matching structures. While the invention will be described in connection with certain embodiments, it will be understood that the invention is not limited to these embodiments. This invention includes all alternatives, modifications, and equivalents as may be included within the spirit and scope of the present invention.

According to one embodiment of the present invention, a method is disclosed for making a quasi-phase-matching structure comprising the steps of: (a) applying a pattern to a substrate to define a plurality of growth regions and a plurality of voids; (b) growing a crystalline inorganic material on only the growth regions in the pattern, the crystalline inorganic material having a first polarity; (c) applying an electric field within a growth chamber containing the patterned substrate with the crystalline inorganic material, wherein the electric field reaches throughout the growth chamber; and (d) growing a crystalline organic material having a second polarity in the voids formed in the inorganic material under the influence of the electric field to influence the second polarity of the crystalline organic material, wherein the second polarity of the crystalline organic material is influenced so as to be different from the first polarity of the crystalline inorganic material in at least one of magnitude (intensity) and direction (orientation).

Depending on the particular polarity properties of the selected crystalline organic material, instead of polarizing of the organic crystal during its growth, post-growth polarization may be performed. The electrical field may be applied after the growth of the organic crystal or it could stay on while the device is operating. Post-growth polarization may be also used to finely equalize, if necessary, the magnitudes of oppositely-oriented polarizations within the inorganic and organic materials or to compensate for any depolarization that occurs over time or due to specific depolarizing events. This provides enormous advantages in that the QPM structure may be adjusted as necessary, even while it is being used, and the QPM structure may even be repaired if the polarization balance is compromised.

The disclosed methods provide distinct advantages over the prior art in that both the organic crystals and inorganic crystals are grown in place in a manner which allows for full control of the polarity of each material independently, to maximize the effectiveness of the structure in frequency-conversion devices. According to a first variation, the method further comprises applying the pattern to the substrate with a material, e.g., a photoresist or $Si_3N_4$, which prevents the growth of the inorganic material on the pattern material to define a half-patterned (HP) template. This provides an advantage in that the pattern of the inorganic crystals may be clearly defined in order to achieve the desired performance characteristics of the structure, including the desired periodicity corresponding to the desired operating frequency. The pattern of growth regions and voids may form a stripe pattern on the substrate, and may be defined by a photoresist material.

According to a further variation, the method further comprises growing the crystalline inorganic material in rectangular shapes forming columns having substantially parallel walls defining the voids. By "substantially parallel" it is meant that the walls are parallel except for localized irregularities or asperities. This provides an advantage in that the inorganic crystals are grown in the desired shape and pattern, which eliminates the need for machining. In addition, the crystalline organic material may be grown between the columns of the crystalline inorganic material, and substantially filling the voids between the columns. By "substantially filling" is meant that the crystalline organic material may have some microscopic bubbles in its volume or at the interface of the organic and inorganic materials that do not detract from the performance of the device. This provides an advantage in that the organic or semi-organic crystals do not need to be formed in advance, but may be formed in a manner which allows them to correspond exactly to the voids between the walls of the inorganic material.

According to another variation, the method further comprises growing the crystalline inorganic material with a hydride vapor phase epitaxy (HVPE) process. This provides an advantage in that the HVPE process is a close-to-equilibrium process, which means that inorganic vapor accumulation and growth of the inorganic materials on the patterned (prohibited of growth) areas is not chemically and physically favored, i.e. there is effectively no growth of the inorganic material in the patterned areas. Accordingly, the growth of the crystalline inorganic material is limited to the growth regions.

According to further variations, the crystalline inorganic material is a homoepitaxially-grown (e.g., crystal over-layer has same crystal orientation as the substrate) or heteroepitaxially-grown (e.g., crystal over-layer has a different crystal orientation as the substrate) semiconductor which forms a half-patterned (HP) crystalline inorganic matrix. These arrangements may reduce or eliminate the need for using orientation-patterned (OP) templates.

According to another variation, the crystalline inorganic material and the crystalline organic material have high non-linear susceptibilities, e.g. a nonlinear coefficient $d_{ij}$ [pm/V] greater than about 15-20 pm/V, depending on the particular application that require the selection of a specific wavelength range, device design, pump light source, etc. Such material properties that are correlated to the material structure, symmetry and orientation are highly useful for achieving the desired performance characteristics of the organic-inorganic structure.

According to a further variation, the crystalline inorganic material and the crystalline organic material have a broad range of transparency, e.g., in the visible, infrared (IR) and terahertz (THz) regions, and may have transparencies in two or more regions. Such material properties are highly useful for achieving the desired performance of the organic-inorganic structure.

According to another variation, the method further comprises applying an electric field to the crystalline organic material in the voids formed in the inorganic material to influence the second polarity of the crystalline organic material, wherein the second polarity of the crystalline organic material is opposite from the first polarity of the crystalline inorganic material in magnitude and direction. The manipulation of the electric field to form the second polarity of the organic crystalline material opposite to the first polarity of the inorganic crystalline material is advantageous for optimal performance of the organic-inorganic structure, such as in a frequency-conversion device.

According to a further variation, the method further comprises growing the crystalline organic material in the voids formed in the inorganic material by at least one of a solution process, i.e., a process of growth from a liquid phase, where the liquid is a solution, which evaporation is controlled in a way to initiate and maintain crystallization; a solvothermal process, i.e., growth from a solution but at high temperature and high pressure; a melt process, i.e., crystal growth from a liquid, where the liquid is a melt, which temperature is controlled in order to initiate and maintain crystal growth on a seed introduced in the melt or of crystallites within the melt; and a vapor process, i.e., a process of direct crystallization from a vapor phase, where the vapor or the mixture of vapors contain the components of the crystal phase. For this purpose the vapor pressure and its transport is controlled to initiate and maintain the crystallization. These processes are advantageous in that they permit the organic crystalline material to be formed in the voids of the inorganic crystalline material directly, ensuring a close fit of the dissimilar materials.

In addition, instead of organic crystals one can grow within the voids of the inorganic HP-matrix a so-called "semi-organic" material. These are a special class of hybrid materials, in which the organic ligand is ionically bonded with an inorganic host. This increases the mechanical strength and the chemical stability of the material, which are among the major disadvantages of the traditional organic materials. With its high damage threshold, wide transparency range and high nonlinear coefficient L-lysine sulfate is an excellent example of such a material. In addition, an advantageous use of organic or semi-organic crystals as a second half of the QPM matrix comes also from their low cost and the flexibility of their molecular design, and from the fact that they can be grown using relatively simple, cost- and energy-efficient growth techniques, such as low temperature growth from melt, growth from solution or from vapor phase in inexpensive, relatively low-tech growth reactors using, in most cases, harmless chemicals and convenient growth conditions, such as atmospheric pressure. Accordingly, either or both organic and semi-organic materials may be used to fill the voids in the inorganic material.

An additional advantage of the organic crystals is that they usually possess smaller refractive indices that will result in periodic self-focusing of the beam when it passes through the organic parts of the QPM matrix. Even the disadvantages of organic materials, such as the fact that organic crystals are relatively soft, i.e. difficult to cut and polish and, in addition, with some small exceptions are not compatible with chemicals used in photolithography, are eliminated to a great extent with the proposed approach because cutting, polishing and photolithography on the organic material will be not necessary. In contrast, if one is attempting to fabricate a QPM structure based entirely on an organic material, then cutting, polishing and photolithography will be necessary to shape the structure and to deposit a series of electrodes to alternate the polarity of the material periodically. The fact that, in general, organic crystals can be grown only in relatively small sizes is also not a problem with the proposed approach, because the growth of the organic part is a small-scale growth, effectively growth in capillaries, which is demonstrated to result in high quality grown organic materials.

Finally, the typically lower thermal conductivity of the organic materials, in comparison to the inorganic materials, is also not an obstacle. When the organic material is incorporated within the inorganic material, with the inorganic material acting as a heat sink, the organic part will be easily and quickly cooled. Ferroelectrics with higher Curie temperatures and liquid crystals are other possible choices for the organic part of the QPM structure.

According to a second embodiment of the invention, a method of making a quasi-phase-matching structure comprises the steps of: (a) machining a pattern into a crystalline semiconductor substrate to define a plurality of voids, the semiconductor substrate having a first polarity; (b) filling the voids with an electret material having a second polarity; and (c) applying an electric field to the electret material to influence the magnitude and the direction of the second polarity of the electret material, wherein the second polarity of the electret material is different from the first polarity. The disclosed methods provide distinct advantages over the prior art in that both the crystalline semiconductor substrate and electret materials may be selected and combined in a manner which allows for full control of the polarity of each material independently, to maximize the effectiveness of the structure as a frequency conversion device.

According first variation, the method further comprises machining a semiconductor substrate pattern to include rectangular shapes forming columns having substantially parallel walls defining the voids, and the pattern of voids may form a stripe pattern on the semiconductor substrate. This provides an advantage in that the pattern of the crystalline semiconductor substrate may be clearly defined in order to achieve the desired performance characteristics of the structure, e.g., in a frequency conversion device. The pattern of growth regions and voids may form a stripe pattern on the substrate, and the stripe patterns may be closely defined as to the depth of the voids, the width of the crystalline semiconductor's walls, and the width of the voids in order to correspond to the desired periodicity and the spectrum of operating frequencies desired in the finished product. In addition, the machining of the semiconductor substrate may be substituted for the growth of the crystalline inorganic material in the first embodiment described above.

According to another variation, the electret material is filled between the columns of the crystalline semiconductor substrate, substantially filling the voids between the columns. This arrangement provides an advantage in that the crystalline semiconductor substrate and the electret material may be closely defined and arranged in alternating layers, and the refractive indices of the substrate and electrets may be selected to provide a focusing effect to maintain the throughput energy beams on a path through each layer without escaping or leaking out the side of the QPM structure.

According to a further variation, the voids in the crystalline semiconductor substrate are formed by sawing or by laser machining. This arrangement provides strict control over the spacing or periodicity of the semiconductor substrate and the electret materials, for achieving the desired operating parameters of the device which incorporates the structure, and to eliminate the need to grow the crystals in the desired pattern.

According to another variation, the crystalline semiconductor substrate and the electret material have high non-linear susceptibilities, e.g. a nonlinear coefficient $d_{ij}$ [pm/V] greater than about 15-20 pm/V, depending on the particular application that require the selection of a specific wavelength range, device design, pump light source, etc. Such material properties that are correlated to the material structure, symmetry and orientation are highly useful for achieving the desired performance characteristics of the semiconductor-electret structure.

According to another variation, the crystalline semiconductor substrate and the electret material have a broad range of transparency, e.g., in the visible, infrared (IR), and/or terahertz (THz) regions and may have transparencies in two or more regions. Such material properties are highly useful for achieving the desired performance characteristics of the semiconductor-electret structure, including as a frequency-conversion device.

According to a further variation, the method further comprises applying an electric field to the crystalline semiconductor substrate and the electret material in the voids to influence the polarity of the electret material, wherein the second polarity of the electret material is opposite in magnitude and direction from the first polarity of the semiconductor material. The manipulation of the electric field to form the second polarity of the electret material opposite in magnitude and direction to the first polarity of the crystalline semiconductor material is advantageous for optimal performance of the structure. The opposite polarities permit the output signal of the QPM frequency conversion device to increase in energy, as is explained below.

According to another variation, the electret materials include photo-electrets, thermo-electrets, and liquid crystals. These materials are useful for enabling the mode of polarity tuning to be selected according to the desired performance characteristics of the structure.

According to a further variation, the method further comprises applying the electric field with one of a second harmonic generator (SHG) or an optical parametric oscillator (OPO), and the method further comprises placing the crystalline semiconductor substrate and electret material within one of the second harmonic generator and optical parametric oscillator. The SHG or OPO may be included in-situ with the QPM structure, allowing the polarization-tuning procedure to be directly and selectively performed, tuning the polarization by additional light "chargings" and/or partly electrical "dischargings" until achieving a maximal output.

According to a third embodiment of the invention, a QPM (quasi-phase matching) frequency conversion device may be made incorporating the various structures described herein. The QPM (quasi-phase matching) structure may consist of one naturally-polarized inorganic semiconductor material with high nonlinear susceptibility and a suitable range of good transparency. The second, organic part could be:

(a) a special type of polymer, i.e., a photo-electret that can be polarized by light. In this case, the photo-electret is melted in advance (without an electrical field), fills the voids in the inorganic half-matrix, and is solidified as it is, i.e. not polarized. The polarization of the polymer can be achieved by illuminating the polymer with and in-situ source, as the in-situ adjustment of the polarization to match the opposite polarization of the inorganic part (in an OPO or SHG scheme, as described herein), and can be achieved by using a grounded potentiometer type electrical scheme that reduces the electrical charge, if necessary. Illumination for polarization and calibration can be performed easily in-situ periodically because the illumination source is a part of the device. There is no need for the polarization light to be coherent, only that it should have the energy to ensure the polarization. In contrast, the pump beam, which will undergo frequency conversion, is coherent. It should not depolarize the inorganic material. In addition, the polarization light could be "on" during the actual frequency conversion operation of the device, e.g., if there is a detected drop in the polymer polarization; or (b) a liquid crystal. In this case, the inorganic material may play the role of a vessel for the liquid crystal material. The polarization of the liquid crystal can be achieved with an electrical field (instead of using light) but, again, with in-situ tuning. This scenario allows the polarization to be influenced by both the applied electrical field or by partially discharging through the potentiometer.

According to another embodiment, a method of making a quasi-phase-matching (QPM) structure comprises the steps of: (a) applying a pattern to a substrate to define a plurality of growth regions and a plurality of voids; (b) growing a crystalline inorganic material on the growth regions in the pattern including voids between crystalline inorganic material growth regions, the crystalline inorganic material having a first polarity; (c) filling the voids in the crystalline inorganic material with a crystalline organic material having a second polarity; and (d) applying an in-situ electrical field within a chamber containing the substrate with the crystalline inorganic wherein the in-situ electric field reaches throughout the growth chamber in order to perform at least one of: (1) polarizing the crystalline organic material part of the QPM structure opposite to the crystalline inorganic material in at least one of magnitude and direction; (2) equalizing the magnitudes of the first and second polarities with opposite directions of polarity; (3) controlling the direction of any spontaneous polarization of the crystalline organic material; or (4) adjusting the second polarity of the crystalline organic material.

According to a further embodiment, a method of making a quasi-phase-matching (QPM) structure comprises the steps of: (a) applying a crystalline inorganic material on a substrate, the crystalline inorganic material having a first polarity; (b) forming voids in the crystalline inorganic material by at least one of sawing and laser machining; (c) filling the voids in the crystalline inorganic material with a crystalline organic material having a second polarity; and (d) applying an in-situ electrical field within a chamber containing the substrate with the crystalline inorganic wherein the in-situ electric field reaches throughout the growth chamber in order to perform at least one of: (1) polarizing the crystalline organic material part of the QPM structure opposite to the crystalline inorganic material in at least one of magnitude and direction; (2) equalizing the magnitudes of the first and second polarities with opposite directions of polarity; (3) controlling the direction of any spontaneous polarization of the crystalline organic material; or (4) adjusting the second polarity of the crystalline organic material.

There are numerous variations which can be made to the basic QPM structure, the basic structure including an inorganic/semiconductor substrate having voids to accept a material having a different polarity. Each of the described methods of making the QPM structure may be swapped according to the desired materials and performance characteristics of the QPM device. For example, the inorganic/semiconductor material may be grown or machined, depending on the particular materials being used and whether acceptable results may be achieved by growing or machining; the organic material may be a polymer, photo-electret, thermos-electret, liquid crystal or another crystalline material; and the QPM structure may include an electric field generator, or the electric field generator may be a separate element.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

FIG. 2C depicts a half-patterned template with grown inorganic material and grown organic material;

FIGS. 3A-3C depict the crystallographic orientations found within a GaP inorganic material;

FIGS. 4A-4C depict sectional and plan views of the deposition of a layer of GaP on a half-patterned template, in particular, the deposition of 470 μm thick GaP on an HP template;

FIGS. 10A-10D depict a schematic representation of the steps for preparation of an inorganic crystal/thermo-electric structure;

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Figure 1:
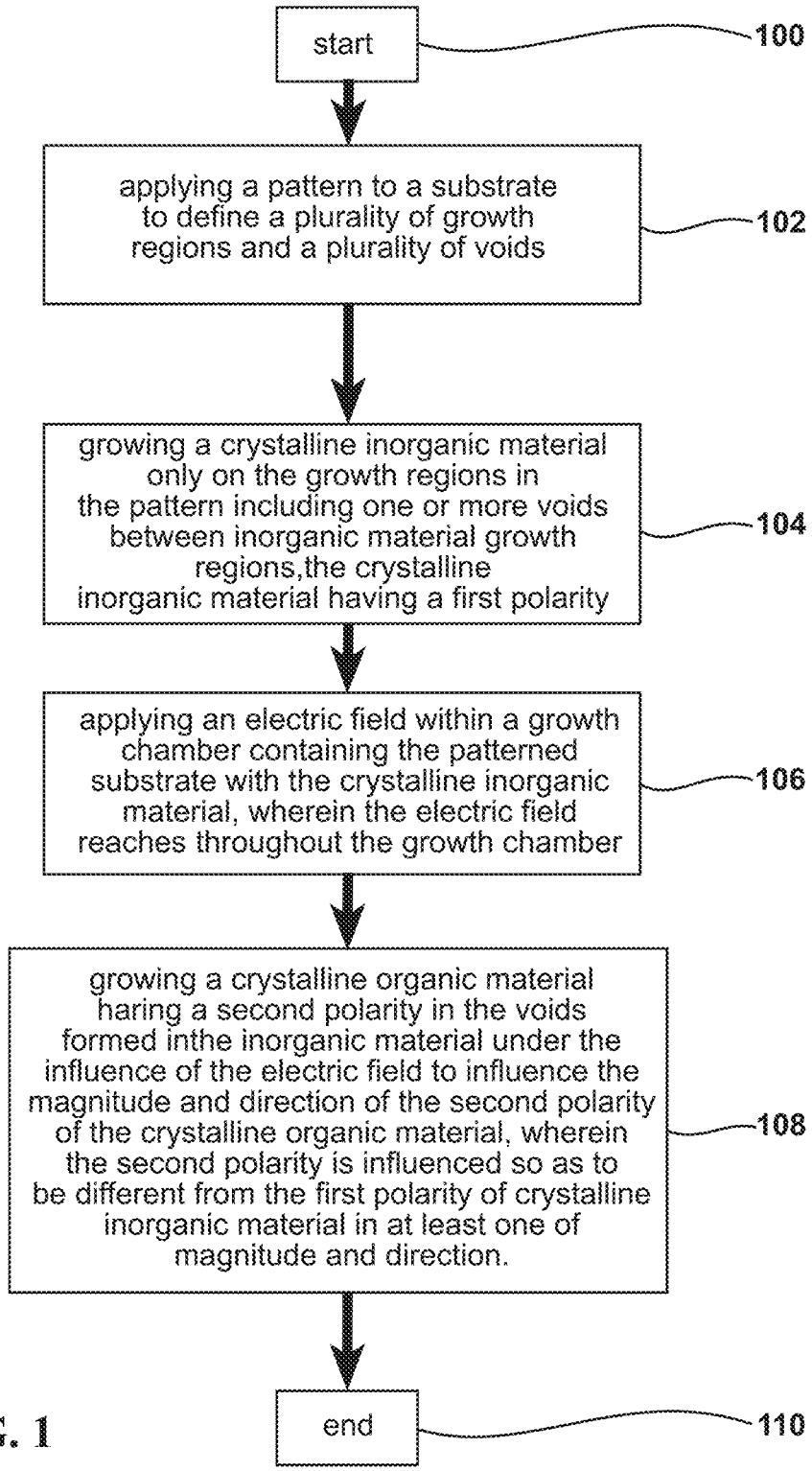
FIG. 1 depicts a method for making a quasi-phase-matching (QPM) structure.

As depicted in the accompanying Figures, a method is disclosed for making a quasi-phase-matching (QPM) structure. The method starts with FIG. 1 (step 100) by applying (step 102) a pattern 12 (see FIGS. 2A-2B) to a substrate 10 to define a plurality of growth regions 14 and a plurality of voids 16; growing (step 104) a crystalline inorganic material 18 on only the growth regions 14 in the pattern 12, the crystalline inorganic material 18 having a first polarity; applying (step 106) an electric field 20 (see FIGS. 5A-5C) within a growth chamber 24 containing the patterned substrate with the inorganic material; and growing (step 108) a crystalline organic material 22 in the voids 16 formed in the inorganic material 18 under the influence of the electric field 20 (see FIGS. 5A-5C) to influence the polarity of the crystalline organic material 22, wherein the polarity of the crystalline organic material 22 is different from the first polarity, which ends (step 110) the method. The electric field 20 influences the QPM structure within the chamber, and the electric field 20 is adjusted to manipulate the polarity of the organic material 22 as it grows in order to achieve the desired polarity in the finished grown organic material 22. The crystalline organic material 22 may be influenced to have its polarity in the opposite direction and the same magnitude as the polarity of the crystalline inorganic material. Other polarity variations may be made as well, depending on the desired performance characteristics of the finished product, e.g. a frequency conversion device.

Figure 2A:
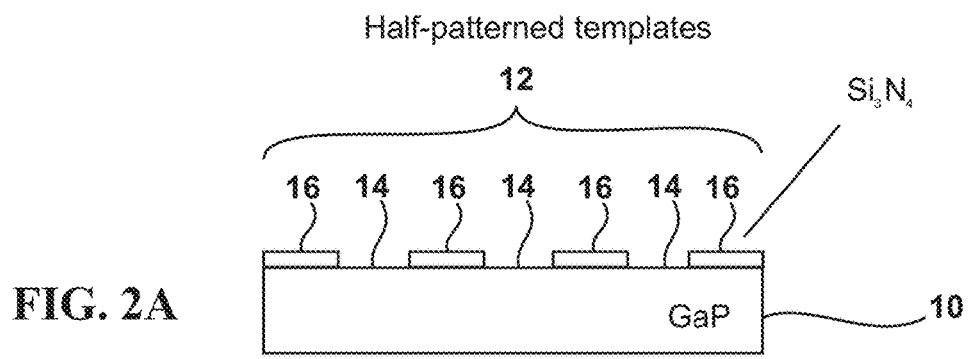
FIGS. 2A-2B depict a sectional view and perspective view, respectively, of a substrate which is half-patterned (HP) as a template, with the HP pattern including stripes perpendicular to the major flat, i.e., oriented along [01$\bar{1}$]
Figure 2B:
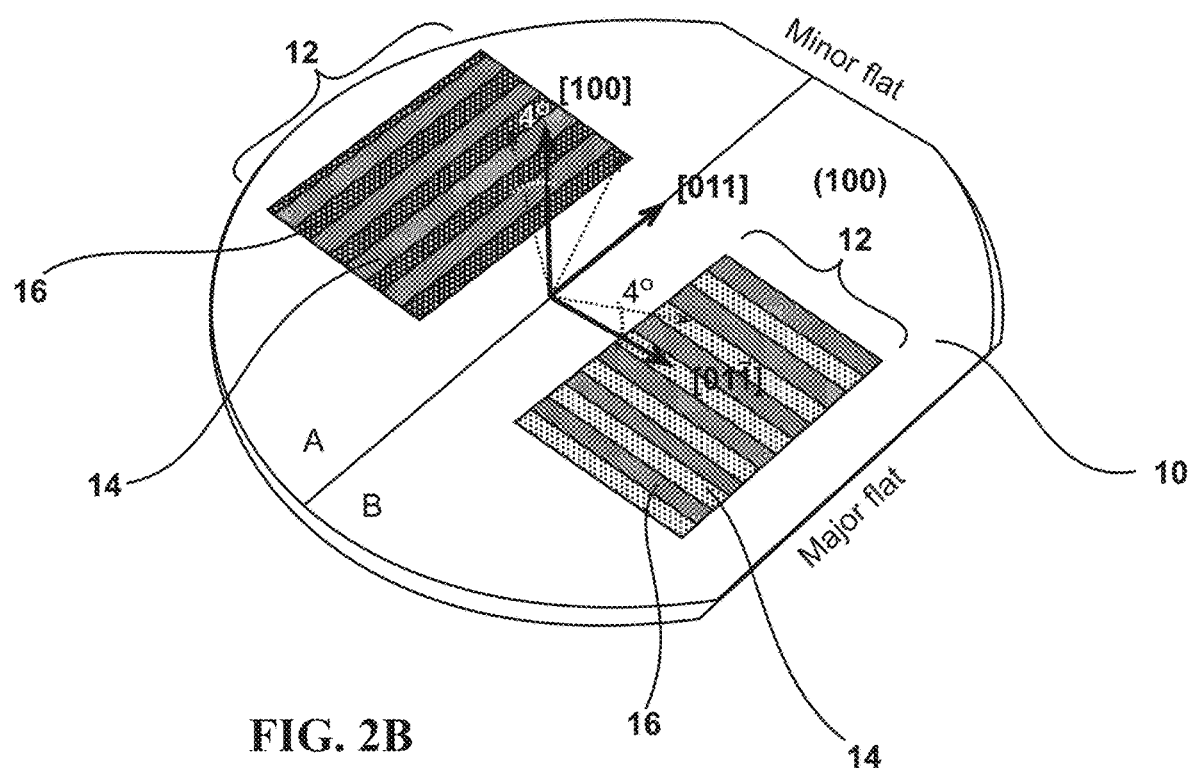

The disclosed methods provides distinct advantages over the prior art in that both the organic crystals and inorganic crystals are grown in place in a manner which allows for full control of the polarity of each material independently, to maximize the effectiveness of the structure. According to a first variation, the method further comprises applying the pattern 12 to the substrate 10 with photoresist or with another material, e.g., $Si_3N_4$. This provides an advantage in that the pattern of the inorganic crystals 18 may be clearly defined in order to achieve the desired performance characteristics of the structure. The pattern 12 of growth regions 14 and voids 16 may form a stripe pattern, e.g., half-pattern, on the substrate 10, as depicted in FIG. 2B.

Preparation of the HP-Templates

The deposition of the HP-template must be performed with a certain crystallographic orientation of the inorganic and organic materials. In the case of GaP inorganic materials this is when stripes (see FIG. 2B) are oriented along [01$\bar{1}$], i.e., perpendicular to the major flat of the wafer. This allows the subsequent HVPE growth on the HP template to form rectangular-shaped mesas, as depicted in FIGS. 2C and 4C. The deposition of the HP pattern relies on the fact that the HVPE technique, in difference to the MOCVD (Metal-Organic Chemical Vapor Deposition) and MBE (Molecular Beam Epitaxy) is a near-to-equilibrium process that does not allow growth on areas that are not conducive for growth, e.g. the voids 16 corresponding to the pattern. The deposition of about 1 µm thin photoresist/$Si_3N_4$ film (FIG. 2A) stripes alternating with stripes open for growth (growth regions 14) is an easy, inexpensive and fast procedure, and defines areas where growth of the inorganic material is not desired. GaP will not grow on the $Si_3N_4$ film. Depending on the crystallographic orientation of the inorganic material, the deposition will insure clear "up" or "down" intrinsic polarization in the structure, as depicted in FIGS. 3A-3C.

There is a significant difference in the growth rate and the shape of the domains depending on the crystallographic orientation. They both are strongly dependent upon the orientation in which the pattern is deposited. For example, the orientation [01$\bar{1}$] (i.e. domains perpendicular to the major flat of FIG. 2B) is the most favorable. In this case the domains have a rectangular shape, as depicted in FIGS. 2C and 4C. In contrast, in the case of orientation [011], (i.e. domains perpendicular to the minor flat of FIG. 2B) the domains have rather triangular or trapezoidal shapes which are not desired. In addition, the vertical growth rate of the inorganic materials in the [01$\bar{1}$] direction is also faster than in the case of [011] direction. An example from the HVPE growth of GaP in these two directions shows a growth rate of 47 µm/h for [01$\bar{1}$] and 44 µm/h for [011].

An additional refinement of the growth of the inorganic material is achieved when the surface plane of the wafer is not strictly oriented with the natural plane (100) of the crystal material, e.g. (100), but is tilted or rotated (miscut) between about 0-10 degrees, e.g. about 4 degrees. This 4 degree change increases the growth rates from 47 to 78 μm/h for orientation [01$\bar{1}$] and from 44 to 47 μm/h for orientation [011]. The 3-digit numbers in brackets, e.g. [100], [010], [001], [01$\bar{1}$], etc. are Miller indices corresponding to the particular crystal orientations, as is known in the art. The three-digit numbers in parentheses, e.g. (100) indicate a plane orientation, while the three-digit numbers in brackets, e.g. [100] correspond to the direction that is perpendicular to the common-numbered plane, as is known for Miller indices. The case of a pattern deposited on a miscut wafer and perpendicularly oriented to the major flat is most favorable from another point of view, too. This orientation is the only known orientation wherein the top surface of the domains are flat and free of any 3D formations, i.e., hillock-free, as depicted in FIGS. 2C and 4C. The crystallographic explanation of this phenomenon is relatively simple: the HVPE is a close-to-equilibrium growth process and in the case of growth on an "on-axis" wafer (not miscut 4 degrees) growth of the crystals relies mostly on surface defects, e.g. the great number of etch-pits, which are usually associated with screw dislocations. Thus crystal growth starts at such a dislocation and in a spiral manner forms a 3D formation, a hillock. In the case of a 0-10 degree miscut, the tilted/rotated surface offers mono-atomic periodic terraces formed during the cut. These terraces offer plenty of sites for the inorganic atoms approaching the growing surface, and they adhere there because this is energetically more favorable than forming hillocks.

Thus, as can be seen in FIGS. 3A-3B, in crystallographic orientation [110] the Ga-atoms are "down", while the P-atoms are "up" (see plane $ADD_1A_1$). This means that in this orientation the top (growing) surface is phosphorus-terminated (P-face). On the contrary, at a 90-degree rotation (see FIGS. 3A and 3C) the atoms on the related plane $BCC_1B_1$ (which is along [01$\bar{1}$] direction) are oriented oppositely, i.e., Ga-atoms are "up", while P-atoms are down, which in this case means that the top (growing) surface is gallium-terminated (Ga-face). It is important to notice that a rotation of 90 degrees alternates the polarity and is, effectively, equal to flipping the sample upside down. In this way, if the HP-pattern is deposited once along [01$\bar{1}$] (perpendicular to the major wafer flat—see FIG. 2B) and once along [110] (perpendicular to the minor wafer flat—see FIG. 2B) we will have the two opposite crystallographic orientations and any subsequent HVPE growth on them will reveal the growth behavior of the two orientations separately without interrupting each other.

HVPE Growth on the Fabricated HP Templates

The growth on HP templates, also known as selective growth, has been studied for several different materials such as InP, GaAs and GaN. However, while some of these studies aimed to achieve a high lateral-to-vertical growth ratio in order to produce submicron thick films for monolithic integration of optoelectronic components, for fabrication of laser structures, or as a defect filter between layers and mismatched substrates (ELO epitaxy in GaN), the present goal is the opposite—to achieve a low lateral-to-vertical growth ratio, i.e., fast, high-quality vertical growth. As explained above, the growth of the inorganic crystalline material is orientation-dependent, as for many materials, e.g., GaP and GaAs, and the growth at suitable V/III ratios, supersaturation and growth temperatures on patterns along [110] results in triangular or trapezoidal mesa shapes, while the growths on patterns along [01$\bar{1}$] repeatedly results in higher growth rates and a rectangular shape of the domains, as depicted in FIGS. 2C and 4C. It has been discovered that the orientation [01$\bar{1}$] (stripes perpendicular to the major wafer flat) is most favorable for achieving fast growth and rectangular mesa shapes. Thus, it is possible to fabricate thick layers of 500 μm and more with excellent domain fidelity.

As explained above, the claimed method requires a first step of growing, such as by HVPE growth, inorganic crystalline material to produce an inorganic matrix with rectangular-shaped parallel slots (growth regions 14), and this growth on HP-templates is much easier and more controllable than the growth on OP-templates, because it is a growth on the most favorable pattern orientation and, in addition, does not need to compensate for the different behavior of the oppositely-oriented domains to try to match their often very different lateral and vertical growth rates and shapes. The image of FIG. 4C depicts a cross section of the HVPE growth of GaP on HP-templates with a pattern perpendicular to the major flat deposited on a (100) GaP wafer with 4° miscut.

Fabrication of the Organic Crystalline Half of the QPM Structure

The fabrication of the inorganic part of the QPM structure is a one-step process that consists of growing of an organic crystal material inside the voids (open slits or growth regions 14) of the grown inorganic HP matrix as a measure to ensure the opposite crystallographic orientation (polarization) of the organic half of the matrix. This can be accomplished if the growth of the organic material 18 is performed in a direct electric field (see FIGS. 5A-5C) in-situ to produce an intensity and orientation or polarity opposite to the polarization within the inorganic material. This polarization of the organic material and the required electrical field 20 can be easily calculated knowing the electronegativity and the distances between the oppositely charged ions in the crystal cell. However, depending on the electrical properties of the chosen organic material, instead of in-situ polarizing of the organic crystalline material during the organic material growth, post-growth polarization with an applied electrical field 20 may be done after the growth of the organic crystal or even during the device's operation. Post-growth polarization can be also used to finely equalize, if necessary, the magnitude of the oppositely-oriented polarizations within the inorganic and organic materials or to compensate for depolarization.

It is noted that many organic crystals have much larger nonlinear susceptibilities than the inorganic materials, i.e., the applied electrical field 20 during the growth of the organic crystals/materials does not need to be as great. This is also beneficial because it means that the electrical field 20 that is applied for post-growth polarization will influence mostly the organic part of the QPM matrix, i.e. the electrical field 20 will not be strong enough to change the polarity within the inorganic material. A special case is when the organic material is a ferroelectric.

Ferroelectrics are materials that under a specific temperature for each material, called Curie temperature, the material possesses spontaneous polarization. In this case the role of the "in-situ" or "post-growth" applied electrical field 20 will be mostly to effect and determine the polarization direction, especially if the ferroelectric material is above under the Curie temperature. If it is above this temperature, then the electrical field 20 will polarize the material that has lost its spontaneous polarization. The difference between the nonlinear susceptibilities of the inorganic and organic materials can also be compensated by using a pattern (see FIGS. 2A-2C) where the slits (growth regions 14) filled with the organic material 18 are narrower than the width of the inorganic domains 22. Table 1 contains the nonlinear susceptibilities of some inorganic and organic materials:

TABLE 1

| | | | | Nonlinear Coefficient $d_{ij}$ [pm/V] | | | | | |
|---|---|---|---|---|---|---|---|---|---|
| KDP | benzo-phenone | GaN | KNbO$_3$ | LiNbO$_3$ | ZnSe | GaP | GaAs | DAST |
| 0.44 | 2.6 | 17 | 21 | 27 | 47 | 70 | 110 | 1010 |

Taking into account two major factors, the second order nonlinear susceptibility and the range of transparency, several organic crystalline materials can be found suitable for the growth of the organic part of the matrix. These include Dimetilamino-4'-N' methyl-stilbazolium tosylate (DAST), 3-hydroxybenzaldehide, benzophenone, etc. . . . . L-lysine sulfate represents the group of the semi-organic materials. However, new organic crystal materials with flexible properly modeled molecular designs, including some liquid crystals and ferroelectrics, are continually made available to the field of nonlinear optics.

The advantage of the organic crystals comes not only from their high nonlinear susceptibility, but also from their high figures of merit (high conversion efficiency), sufficiently-high laser threshold and wide range of transparency. In addition, the organic crystals, as distinguished from the inorganic nonlinear materials, do not need expensive growth equipment and techniques such as MBE, MOCVD and HYPE. They can be produced at much lower growth temperatures using several simpler growth techniques such as melt growth techniques, or EFG (Edge Defeated Growth), growth from solutions (where common harmless solvents and conditions, e.g., an atmospheric environment and pressure are used in most of the cases), solvothermal growth (a solution growth performed at higher ambient pressure), or vapor phase growth.

Figure 5A:
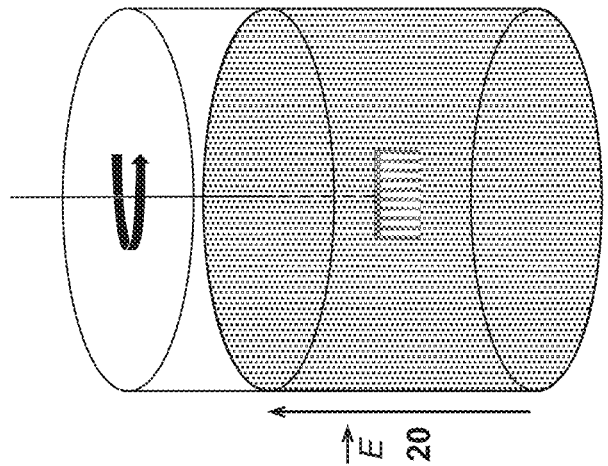
FIGS. 5A-5C depict various organic crystal growth processes.
Figure 5B:
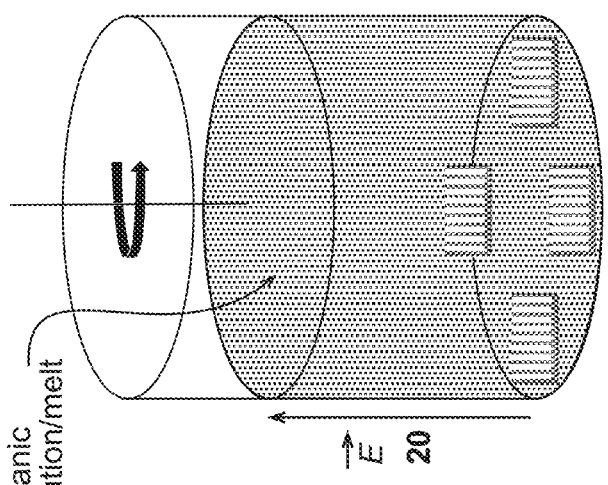
Figure 5C:
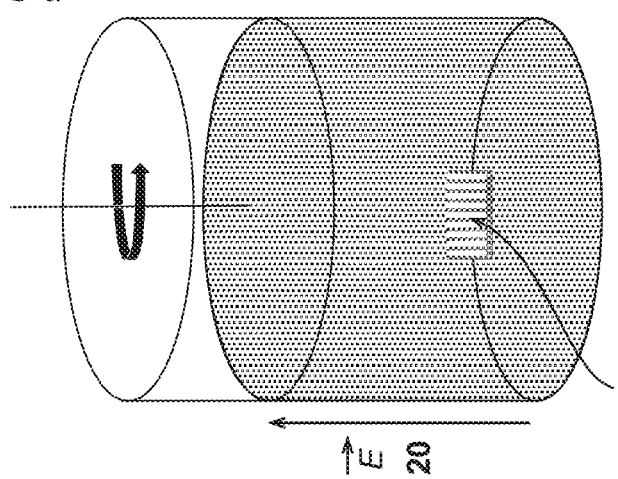

The proposed approaches, as depicted in FIGS. 5A-5C are variations of one or more of these techniques or a combination of more than one of these techniques. FIG. 5A depicts a process wherein one or multiple seed crystals, e.g., inorganic HP structures, can be introduced into the growth chamber that is positioned in a proper temperature gradient to control crystallization. FIG. 5B depicts an organic solution/melt process. The organic crystal growth can be favored by taking advantage of several different crystal growth approaches. For example, the process might resemble simultaneously solution and vapor phase growths performed in the microscopic voids (growth regions 14) determined during the HVPE growth of the inorganic half of the structure. These voids (growth regions 14) resemble growth in capillaries, which is useful in the case of organic materials, as explained above. Practically, the best quality dislocation-free crystals grown include Thymol and Na$_2$S$_2$O$_3$.5 H$_2$O crystals grown in capillaries from undercooled melt. The major disadvantage of growth of organic crystals—they are grown in relatively small sizes (often in the mm range)—which is an obstacle in using organic crystals alone in QPM devices. It is not a disadvantage in the proposed approach, however, because in this case small dimension crystal growth is desired.

According to a further variation, the method further comprises growing the crystalline inorganic material in rectangular shapes forming columns (inorganic material 18, as depicted in FIGS. 2C and 4C) having substantially parallel walls defining the voids in which the organic materials 22 are grown. By the term substantially parallel is meant that the walls of the inorganic crystalline material define walls which are parallel by the nature of their crystalline growth, but which might have some small irregularities, asperities or imperfections. This provides an advantage in that the inorganic crystals are grown in the desired shape and pattern, and which eliminates the need for machining. In addition, the crystalline organic material may be grown between the columns of the crystalline inorganic material 18, and substantially filling the voids between the columns (see FIG. 2C). By the term substantially filling is meant that the organic material fills the voids of the inorganic structure, but that a few extremely small voids may remain. The growth of the organic material provides an advantage in that the organic crystals do not need to be formed in advance, but may be formed in a manner which allows them to correspond exactly to the voids (growth regions 14) between the walls of the inorganic material.

The growth of the organic material can be performed in a small chamber placed in a relatively low temperature resistive furnace. Even when grown from melt most of the organic crystals grow at temperatures lower than 300° C. and in atmospheric environment and pressure. The only strict requirement is the appropriate control of the temperature, which to ensure smooth uninterrupted growth should be maintained in the range of about ±0.01° C. of optimal growth temperature. The organic raw material is typically kept initially in a liquid phase as a solution or melt, although growths from other aggregate stages, e.g. vapor, are not excluded. After performing the HVPE growth on the HP template, the prepared inorganic half of the QPM matrix is introduced as a seed in the organic liquid material, whether solution or melt (see FIG. 5A). Several or many seeds may be introduced for multiple growths (see FIG. 5B). The seeds may also be positioned with the grown inorganic pattern facing up (see FIGS. 5A-5B) or facing down (see FIG. 5C). Regardless of the particular process selected, the liquid will fill-in the free slots (voids or growth regions 14) due to gravitational forces (FIGS. 5A-5B), or due to capillary forces (see FIG. 5C), similar to the case of the EFG (Edge Defeated Growth) growth technique.

In order to perform the organic crystal growth in the inorganic material's voids, the wetting compatibility of the solid (inorganic HP structure) in relation to the solution or melt at different temperatures should be determined. Rotation of the seed or the liquid can be performed for better mixing and temperature uniformity. The electrical field 20 must be oriented in a direction opposite to the natural polarization in the inorganic material, which can be determined by the direction in which the pattern on the HP template has been prepared. The intensity (strength) of the electric field must be correlated to the total polarization in the semiconductor inorganic material. However, depending on the electrical properties of the chosen organic material instead of in-situ polarizing of the crystal during the growth, post-growth polarization with an applied electrical field may be done after the growth of the organic crystal or even during the device's operation. Post-growth polarization can be also used to finely equalize, if necessary, the magnitude of the oppositely-oriented polarizations within the inorganic and organic material or to compensate for any depolarization. A vertical temperature gradient should be established and the orientation of the seed(s) (up or down) should be taken into account. From this point, in the case of solution growth, the crystallization can be initiated and maintained by either a slow and precise reduction of the liquid temperature or by precise control of the evaporation of the solution at a constant temperature that gradually increases its supersaturation and thus the chances for crystallization. Establishing a suitable temperature gradient and slowly pulling the seed(s) out of the chamber is another approach to initiate and maintain the crystallization process, which may be preferred in case of melt growth so that the seed(s) do not "freeze" inside the cooling melt if a reduction of the liquid phase over the time is also undertaken.

In summary, the proposed invention is an elegant solution that combines a simplified vapor phase growth of inorganic semiconductor crystals with the relatively simple growth of organic crystals from liquids, whether solutions or melt. Scaling down the growth of the organic half of the QPM structure to the capillary-size growth solves another important issue with the organic crystals—the usual lack of high-quality larger size organic crystals. For the present applications they are just not necessary.

According to another variation, the method further comprises growing the crystalline inorganic material with a hydride vapor phase epitaxy (HVPE) process. This provides an advantage in that the HVPE process is a close-to-equilibrium process, which means that growth on the prohibited areas, as defined by the pattern (photoresist or $Si_3N_4$) applied to the substrate, is not likely.

According to further variations, the crystalline inorganic material may be a homoepitaxially- or heteroepitaxially grown semiconductor which forms a half-patterned (HP) crystalline inorganic matrix grown on a HP-template. These arrangements eliminate the need for fabrication and use of orientation-patterned (OP) templates. HP templates are easy to prepare, as explained above.

According to another variation, the crystalline inorganic material and the crystalline organic material have high non-linear susceptibilities. High nonlinear susceptibilities are such that they are useful for achieving the desired performance of the organic-inorganic structure, e.g. as a frequency conversion device.

According to a further variation, the crystalline inorganic material and the crystalline organic material have a broad range of transparency, e.g., in the visible, infrared (IR) and terahertz (THz) regions. Such material properties are highly useful for achieving the desired performance of the organic-inorganic structure.

According to another variation, the method further comprises applying an electric field 20 to the crystalline organic material 22 in the voids 14 formed in the inorganic material 18 to influence the polarity of the crystalline organic material, wherein the polarity of the crystalline organic material is opposite from the first polarity. The electric field 20 is applied "in-situ" or "post-growth" and manipulated or adjusted to form the polarity of the organic crystalline material opposite to the polarity of the inorganic crystalline material. This is advantageous for optimal performance of the organic-inorganic structure. There is an additional advantage of the proposed approach: only one polarity (one electrode on the top and one on the bottom) is necessary to polarize the organic half of the QPM structures. However, the use of two different materials may increase the optical losses in the interfaces. However, establishing a physical interface will allow material with oppositely polarized domains.

According to a further variation, the method further comprises growing the crystalline organic material 18 in the voids 14 formed in the inorganic material 22 by at least one of a solution process (a process of growth from a liquid phase, where the liquid is a solution, which evaporation is controlled in a way to initiate and maintain crystallization), a solvothermal process (growth from a solution but at high temperature and high pressure), a melt process (crystal growth from a liquid, where the liquid is a melt, which temperature is controlled in order to initiate and maintain crystal growth on a seed introduced in the melt or of crystallites within the melt), and a vapor process (a process of direct crystallization from a vapor phase, where the vapor or the mixture of vapors contain the components of the crystal phase. For this purpose the vapor pressure is controlled to initiate and maintain the crystallization). These processes are advantageous in that they permit the organic crystalline material to be formed in the voids of the inorganic crystalline material directly, ensuring a close fit of the dissimilar materials.

Development of Inorganic, Semi-Organic and Organic Electret Materials

With regard to the second embodiment of the invention, inorganic, semi-organic and organic electret nonlinear materials—crystalline, polycrystalline, and amorphous (e.g. glasses and polymers)—have some indisputable advantages in comparison to their inorganic counterparts. Such advantages include their higher (some times more than one order of magnitude higher) nonlinear susceptibility and ultrafast response that allows the achievement of much larger nonlinear optical (NLO) efficiency. In addition, they can be grown from solutions, melts and vapors at relatively low temperatures—usually less than 300° C., even <100° C., using a number of different relatively simple and affordable techniques. However, the development of organic materials, which can be divided into two parts, i.e. organic crystals and organic polymers, also has its own issues briefly described below.

For high-speed second-order NLO applications, such as electro-optics (EO), second-harmonic generation (SHG), optical parametric oscillation (OPO), and optical rectification (OR), including terahertz (THz) wave generation, a highly asymmetric electronic response of the material to the external electric field is required. Second-order NLO organic materials are most often based on n-conjugated molecules (chromophores) with strong electron donor and acceptor groups at the ends of the n-conjugated structure. Such molecules must be ordered in an acentric manner in a material to achieve a macroscopic second order NLO response. This is most often realized by incorporating the NLO chromophores into a polymer matrix, and pole the composite under the influence of a strong DC electric field close to the glass transition temperature. Poled polymer systems are particularly interesting due to their relatively easy thin-film processing and subsequent device fabrication by using conventional photolithography. Another possibility to obtain an efficient macroscopic second order active NLO organic material is to order the NLO molecules in an acentric structure by crystallization. Single crystals do have some advantages over poled polymers: they have a high chromophore packing density, and they are orientationally stable. Furthermore, organic crystals show a superior photochemical stability than polymers. However, one should have in mind that highly polar molecules tend to aggregate in a centrosymmetric crystalline arrangement, and therefore, only certain specially designed chromophores can be used for the growth of NLO crystals. In addition, the processing of organic crystals, especially in thin films needed for integrated photonic structures, is generally much more challenging than for polymers.

Figure 6A:
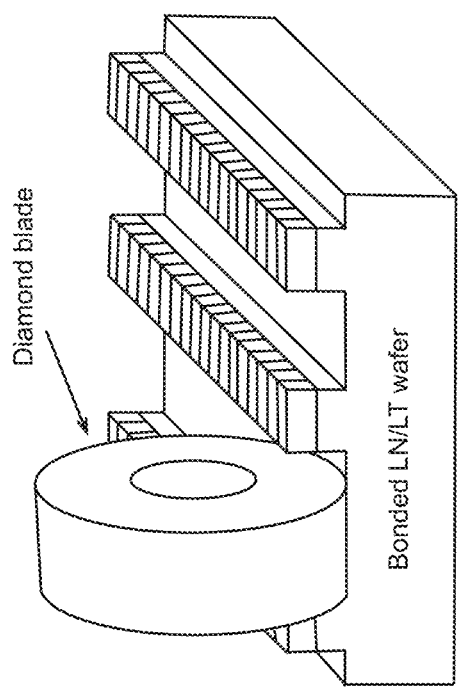
FIG. 6A depicts the machining of a periodic furrow pattern in the inorganic material with a fine diamond blade.
Figure 7B:
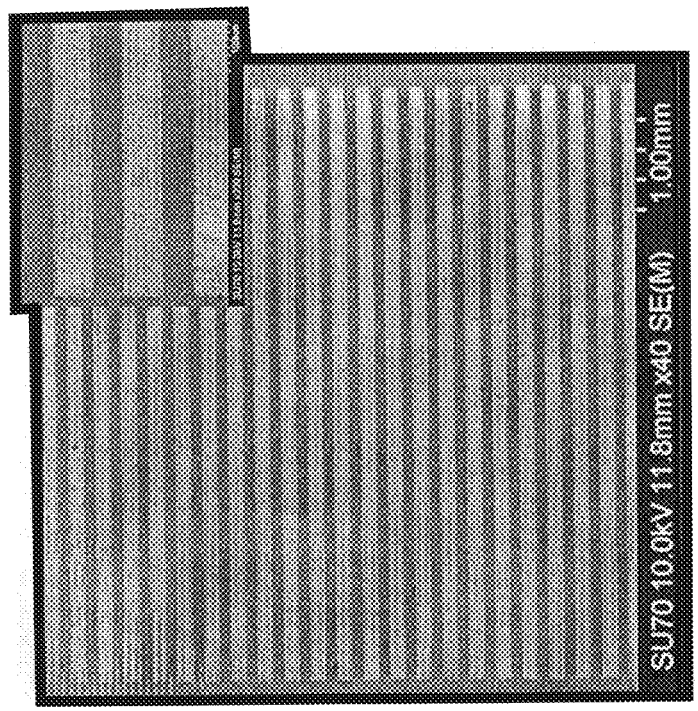
FIG. 7B depicts SEM images of a GaAs wafer furrowed using a femtosecond laser.
Figure 7A:
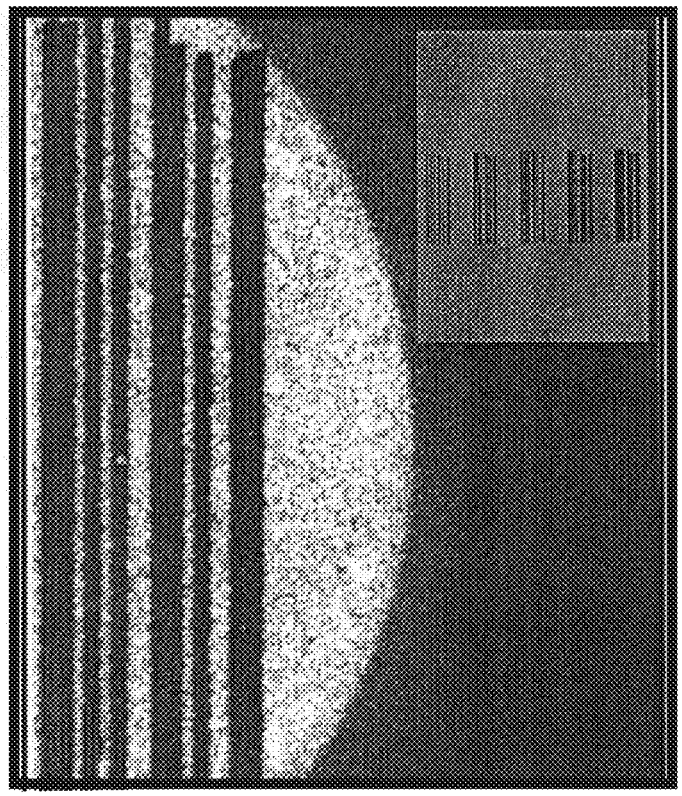
FIG. 7A depicts a GaP wafer furrowed using an Yttrium fiber laser.

The preparation of inorganic semiconductor materials for nonlinear optical applications is expensive and complex, while organic materials are much cheaper and, due to their lower melting points, can be prepared or grown in less-energy consuming processes using simpler and relatively low-tech equipment. The growth techniques for most inorganic materials require the use of poisonous, flammable and corrosive gases such as arsine and phosphine. In contrast, neither the inorganic materials of the present invention, nor the processes of their fabrication contain or use dangerous chemicals. The preparation of orientation-patterned templates based on inorganic semiconductors itself is a complex, time-consuming process that often requires the use of expensive scientific equipment such as MBE (molecular beam epitaxy). In addition, the prior art template preparation process for OP templates of one material is not a universal process but rather a unique technique for each particular inorganic semiconductor material, i.e. it cannot be just copied 1:1 from one material to another. In contrast, the proposed approach is universal, i.e. it can be applied to different inorganic-organic material couples. In all these cases the QPM structure always consists of a periodically pattered inorganic sample where areas with one and the same crystal polarity alternates with deep furrows filled in with crystalline or amorphous nonlinear material. The furrowing can be achieved by the epitaxial growth on the so-called "half-patterned" (HP) templates. The fabrication of such a template that consists of a striped pattern in which every other stripe is prohibited from growth by the deposition of a thin layer, e.g. $SiN_4$, is a fast and inexpensive procedure, as explained above with regard to the first embodiment of the invention. The growth on such templates, in contrast to the growth on fully orientation-patterned (OP) templates, is also relatively easy. Although this dramatically simplifies the preparation of the inorganic part of the structure, the fabrication of patterned (at least half-patterned) templates and performing a subsequent thick growth on them are still unavoidable steps in the preparation of the QPM structure. Fortunately, there are inexpensive and easier growth-free ways for furrowing the crystal templates— machining by using a fine diamond blade, as depicted in FIG. 6A, or by using a laser engraving technique (see FIGS. 7A-7B). The laser cutting (ablation) technique is preferable to mechanical machining, because in order to satisfy the QPM conditions the furrows' width must be different for each wavelength. Thus a new diamond blade has to be fabricated for each new case. In addition, the minimum size of the diamond blade is restricted—blades smaller than 100 μm are hard to fabricate. In contrast, laser cutting can achieve a minimal cut width of up to 15 μm, even less—this depends only on the ability to focus the light at a given wavelength. In addition, furrows more than 10 mm deep can be easily achieved as the heat-affected zone along the cut is very small (up to 2 μm). Laser cutting is a cheap, routine procedure that many vendors offer and apply to various crystalline or amorphous materials starting from stainless steel, glass and quartz and finishing with wood, paper and cloth for use in a wide variety of areas starting from science, through industry to art. Many traditionally laser engraved crystalline materials, e.g. quartz, have actually much smaller thermal conductivity than the ones we propose to use for the purposes of this invention (see Table 2 below). In addition to this fabrication convenience the high thermal conductivity of the inorganic crystal matrix is more effective in cooling the organic filler during laser pumping with the frequency that is being converted. Organic materials usually have lower melting points. Thus, being in touch with a fast heat-conducting medium (akin to a heat sink) will protect the organic materials and will contribute to better overall device performance.

Using a combination of a laser cutting (ablation) technique for fabrication of the inorganic half of the QPM structure and filling the cut slits with an organic material avoids the usage of expensive equipment for both template preparation and growth on them and eliminates the need to match the lateral and vertical growth rates of the oppositely oriented domains. One inorganic nonlinear material where these difficulties can be easily surmounted is the periodically poled $LiNbO_3$ (PPLN). PPLN is a ferroelectric material, i.e. it can be easily polarized by applying an electrical field. Unfortunately, although PPLN a success on the production line, due to its strong intrinsic absorption beyond 4 μm it can barely cover only one of the two atmospheric windows of transparency in the IR region. In contrast, there are a number of organic materials that are ferroelectrics and that can be easily polarized—some even possess spontaneous polarization under a practical (high enough) Curie temperatures. A hybrid QPM structure between an inorganic semiconductor material and an inorganic, semi-organic or organic ferroelectric crystalline or amorphous (glasses or polymers) electret material is an elegant solution that will advance the development of the next generation bright, tunable, portable and low-cost frequency conversion devices in the mid- and long-wave IR and THz regions.

The proposed approach is universal, i.e. it can be successfully applied to any new material system. This is possible because the fabrication of OP templates is replaced by the much easier procedure of mechanical machining or laser engraving, which is not a time-consuming process and does not require expensive growth equipment. The pattern may be furrowed with a depth of at least 400-500 μm in a certain crystallographic orientation. In the case of GaP this is when stripes (see FIG. 2B) are oriented either along the [01$\bar{1}$]) or along [011], i.e. perpendicular or parallel to the major flat of the wafer. When the matrix with the parallel furrows is ready, neither HVPE nor any other type of crystal growth is necessary. Instead of crystal growth, the growth is replaced by another low-tech and simpler technique for filling the furrowed spaces, the capillaries, between the columns with an IR transparent electret with a sufficiently-high nonlinear susceptibility, and a relatively low melting temperature. Accordingly, the process is less energy-consuming and does not involve any dangerous chemicals. The purpose of this procedure is to introduce the electret material into the capillaries to fill the open spaces (capillaries) between the vertical columns (see FIGS. 5A-5C). To provide the opposite material polarization of the electret with regard to the template, the melting and the freezing of the electret material must be performed in a constant electric field with the needed orientation and intensity (some polymeric electrets can be polarized by straining as well). This simplifies the process of preparation of QPM structures that can be used in frequency conversion devices. Replacing a complex and prolonged procedure that requires the use of expensive pieces of equipment and highly experienced personnel with a simple low-tech unified growth-free procedure may dramatically reduce the price of the final product and will allow applications not even dreamed of at this time.

Particularly, by producing high-quality OP materials as an active medium for FCDs (frequency conversion devices), this invention will accelerate the development of next-generation high power, high brightness, and broadly tunable, compact, room temperature operating, coherent IR and THz sources. This in turn will facilitate advances in a broad range of military applications (e.g. IR countermeasures, laser radar, IR communications in extreme environments and atmospheric conditions); commercial applications in environmental sensing and security (e.g. scanners, remote sensing of chemical and biological agents); medical applications (e.g. biopsy-free detection and visualization of cancer cells), and scientific research (e.g. spectroscopy).

Following is an example of what impact this invention may have in the development of IRCMs (infrared countermeasures): The existing IRCMs are expensive ($1.5M-$6M per unit according some public domains). Their "Jammer-to-Signal" (J/S) ratio is as low as 2:1 to max 50:1, and they provide at best incomplete coverage of one of the two IR atmospheric transmission windows (2-5 µm or 8-13 µm) only. This invention will facilitate and accelerate the development of cost-effective, portable and reliable IRCMs supplied with high efficient, high output power, room temperature operating laser sources with expected J/S ratios of 300:1-2000:1 and tunability high enough to cover both IR windows of transparency. Namely, the expected significant reduction of the coherent source component cost is a key that will make the next-generation IRCMs affordable for smaller military and even for civilian aircraft.

Fabrication of the Inorganic (Crystalline) Half of the QPM Structure

There are several different approaches for fabrication of the inorganic half of the structure. We have chosen to form the pattern by furrowing the sample with a conventional laser cutting (engraving) equipment that provide high level of accuracy in machining of a wide range of materials. This entirely eliminates the use of a complex, expensive and time consuming HVPE growth process.

Furrowing of the sample: To allow the intended wave mixing processes to occur in the finished device, furrowing may be performed up to at least 400-500 µm depth. It also should be done with such periodicity that will meet the quasi-phase conditions for the desired frequency conversion. At the same time the furrowing must be also in a certain crystallographic orientation that provides the maximum polarization of the material. The suitable orientation of the pattern can be determined from the related crystallographic orientation. In the case of zinc blende diamond-like structured materials such as GaAs and GaP, maximal polarization in the material can be achieved when the furrows (i.e., the domains) are oriented either along [01$\bar{1}$] (perpendicular to the major flat of the wafer) or along [011] (perpendicular to the minor wafer flat (FIGS. 2A-2C).

Thus, as one can see from FIGS. 3A-3B, in crystallographic orientation [110] the Ga-atoms are "down", while the P-atoms are "up" (see plane $ADD_1A_1$). This means that in this orientation the top surface is phosphorus terminated (P-face). However, at a 90-degree rotation the atoms on the related plane $BCC_iB_i$ (which is along [01$\bar{1}$] direction) are oriented oppositely (see FIGS. 3A and 3C), i.e. Ga-atoms are "up" while P-atoms are down—the top surface is gallium terminated (Ga-face). This means that a rotation of 90 degrees alternates the polarity and is equivalent to flipping the sample upside down. Thus, if we furrow the pattern once along [01$\bar{1}$] (perpendicular to the major wafer flat—see FIG. 2B) and once along [110] (perpendicular to the minor wafer flat—see FIG. 2B) we will have the two opposite crystallographic orientations.

Figure 6C:
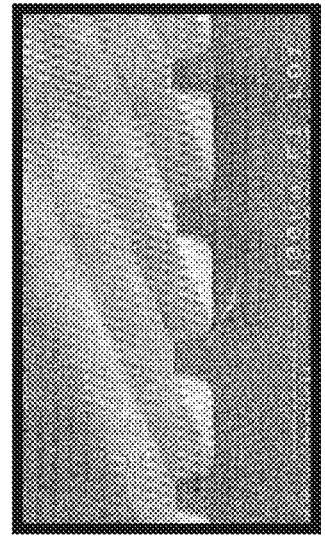
FIGS. 6B-6C depict sectional views of a GaP sample furrowed mechanically.
Figure 6B:
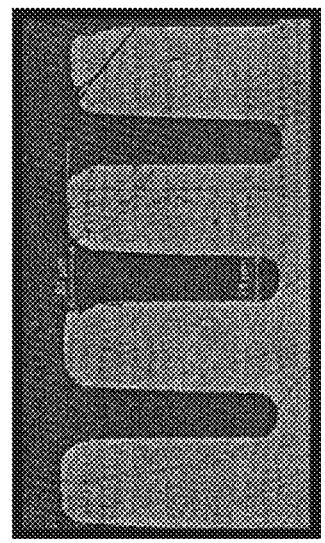

Furrowing of the sample can be done by machining the sample with a fine diamond blade or using a conventional laser cutting equipment. These two fabrication approaches are described below:

Machining of the Furrows with a Diamond Blade:

The mechanical machining (furrowing) of the sample to fabricate the inorganic crystalline part of the QPM structure can be done with a fine diamond blade (FIG. 6A). The furrows can be deep enough (300-400 µm) for the pump laser beam freely to propagate as the furrows' width can be small enough to satisfy the QPM conditions for at least some frequencies. As cross section images show (FIGS. 6B-6C), the slits are slightly tapered and rounded at the bottom, but still acceptable.

Although machining with a diamond blade provides satisfactory results, this approach is restricted by the minimum possible blade sizes that can be fabricated. The same conversion of frequency at different wavelengths will require diamond blades with different thicknesses. For some dimensions their fabrication could be difficult or even impossible due to established instrumentation standards. In addition, the approaching blade introduces material vibrations that can be critical, especially at the moment the blade touches the sample. At the same time, depending on the crystallographic structure, some orientations are more favorable for cutting than others in which the sample is more likely to crack rather than cut. The orientation that is favorable for cutting might not be the best one for frequency conversion. A deeper view at the crystallographic structure of the material (FIGS. 3A-3C) can easily reveal which orientation is best for cutting and which for frequency conversion.

Laser Cutting of the Furrows

As the laser beam can be focused on a very small diameter for high precision, fine cuts are possible with a minimum cut width as small as 15 µm with up to 10 mm depth. In addition, because the heat-affected zone along the cut is very small (up to 2 µm), any deformations in the material can be avoided and annealing of the sample to release the strain introduced during cutting (in contrast to the diamond blade cutting) is not necessary. As a bonus, the inorganic semiconductor materials such as GaAs and GaP that are of current interest for frequency conversion devices have much higher thermal conductivity in comparison to some traditional materials for laser cutting/engraving like quartz and sapphire (see Table 2). This means they will absorb the heat from the cutting laser beam much faster.

TABLE 2

Thermal conductivity of different crystalline materials
Thermal conductivity at 300K [W · m$^{-1}$ · K$^{-1}$]

| Quartz | Sapphire | GaAs | GaP | Si |
|---|---|---|---|---|
| 6.8-12 | 27 | 55 | 110 | 130 |

The next images (FIGS. 7A-7B) depict laser ablation of a GaP (FIG. 7A) sample and a GaAs (FIG. 7B) sample. The GaP sample was furrowed using an Yttrium fiber laser, while the GaAs sample used a femtosecond laser. The images show well-shaped straight cuts with widths as small as 20-50 µm at a minimal distance between them of about 20 µm.

Fabrication of the Electret Half of the QPM Structure

Once the inorganic semiconductor half of the matrix has been prepared by either machining or laser engraving (ablation) of the furrows in the pattern with the needed width, depth and periodicity, the second half of the matrix is prepared. The fabrication of the second part of the QPM structure consists of filling the parallel slits (cuts or capillaries) made on the inorganic patterned (engraved) matrix with an electret material with suitable nonlinear properties, such as high transparency (e.g., in the IR and THz region)

and high nonlinear susceptibility. As a second step, the electret must be polarized to about the same extent but in the opposite direction in accordance with the polarization of the inorganic semiconductor crystalline material. These principles were discussed above. Below are some examples of suitable electret materials and some brief descriptions of possible filling and polarizing procedures.

Electrets are dielectric materials that can store for a prolonged period of time (months or years) steady electrical charges or/and a dipole orientation (polarization), which can be released (discharged or depolarized) using approximately the same charging or polarizing influence, e.g. electrical field, temperature or light. Thermo-electrets are materials that can be polarized (or charged) when they are melted and during their solidification in the presence of a direct electric field. The electret family includes a number of other materials that can be polarized or charged in many other different ways such as by light (photo-electrets), magnetic field (magneto-electrets), even sound (acousto-electrets), or a combination of them (photo-thermo-electrets, etc.) and the presence of the electrical field during polarization (charge) is used to determine the polarization direction. At the same time the electrets can be inorganic or organic semiconductor or dielectric, crystalline, polycrystalline, or amorphous (glasses or polymer) materials, or materials that have two or more different material parts within their molecules, for example, one organic and one inorganic—the so-called "semi-organic" materials. They can be in the shape of bulk solid materials or as thin deposited layers. In addition, they can be liquids, e.g. liquid crystals. The molecular design of these materials is, fortunately, very flexible and allows endless variations in the attempts to pursue the best materials properties and characteristics that are suitable a specific application. The applications include a wide variety of devices, from microphones and air filters for collecting dust to copy machines and optical memories. Photo-electrets deserve special attention. Different areas within a photo-electret can be charged differently depending on the light intensity. The first material in which the photo-electret state (PES) was demonstrated was polycrystalline sulfur. Later a PES was found in many other materials including wide-band-gap semiconductor materials, crystalline or amorphous, such as the amorphous semiconductors Se, $As_2Se_3$, and $As_2S_3$ or in chalcogenide glasses—$As_2S_3$—$As_2O_3$, Ase $S_3$—$GeS_2$, or $As_2S(Se)_3$—$Ge_2S(Se)_3$ and films evaporated from these glasses on different substrates.

Figure 8A:
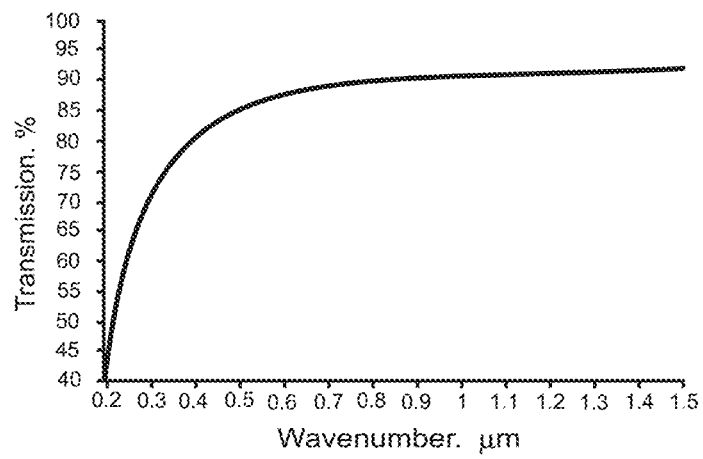
FIG. 8A illustrates an embodiment of UV, visible and near-IR transmittance spectra of a poled PVDF.
Figure 8B:
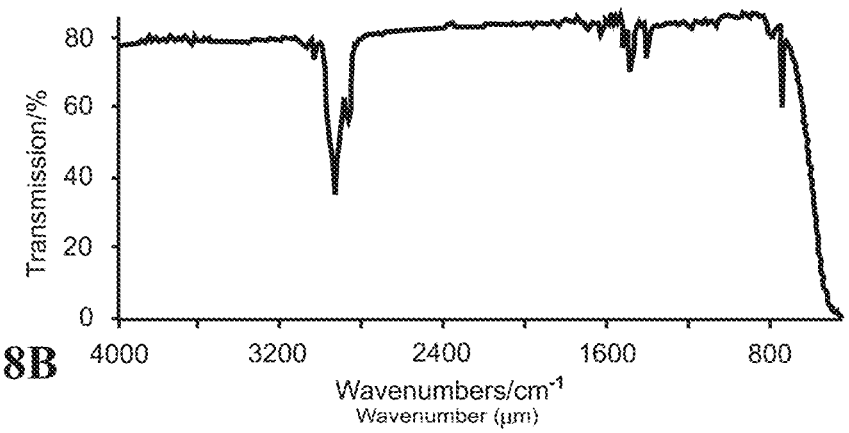
FIG. 8B is an illustration of the FTIR spectrum of ethylene-vinyl acetate poly mer.

Taking into account two major factors, the second order nonlinear susceptibility and the range of transparency of the material, several suitable inorganic, organic or semi-organic polymer thermo- and photo-electret materials can be chosen for current applications. Such are polyethylene terephthalate (PETP), polytetrafluoroethylene (PTFE), and cyclic olefin copolymers (COC). Some other polymeric electret choices could be polyvinylidene fluoride (PVDF) (FIG. 8A), polymethyl-methacrylate (PMMA), poly-bis-phenol-A carbonate and, especially, some polymers with a good IR transparency, such as ethylene-vinyl acetate (FIG. 8B), which by the way may cover the two atmospheric windows of transparency (FIGS. 9A, 9B).

Figure 9A:
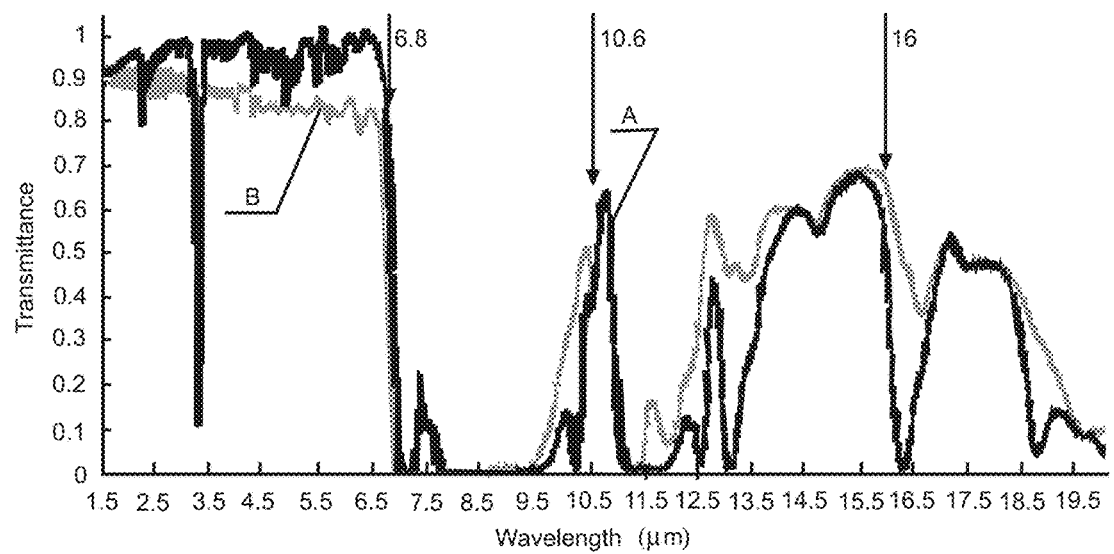
FIG. 9A illustrates an embodiment of the PVDF transparency in the IR region.
Figure 9B:
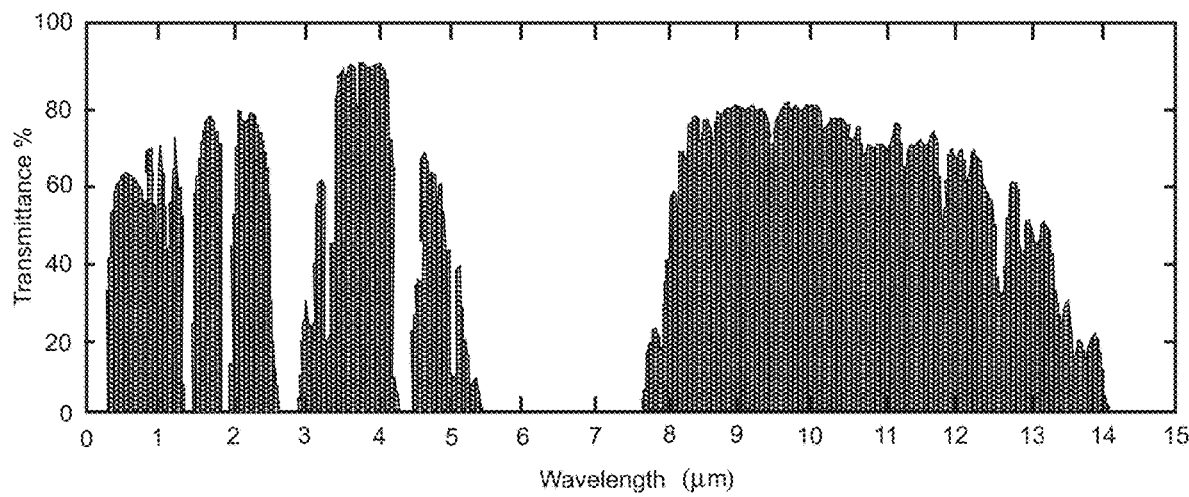
FIG. 9B depicts the atmospheric windows of transparency in the IR region between 2-5 and 8-12 µm.

FIGS. 9A-9B also demonstrate that PVDF, which has a transparency (FIG. 9A) that closely follows atmospheric transparency in the IR region (FIG. 9B), is another example of such a material.

Figure 8C:
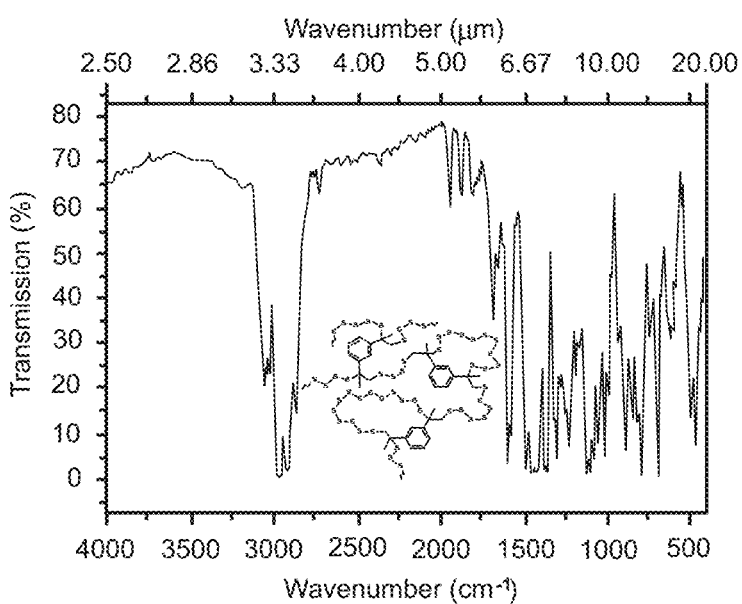
FIG. 8C illustrates an embodiment of IR transmission of a polymer with a balanced molecule.

The properties of a polymeric electret, for example, the charge storage and the dipole orientation depend on many factors, such as chemical impurities, macro-molecular arrangements, and degree of crystallinity. The major reason for the IR absorption in the polymers is molecular vibrations, as a result that the polymer molecule is usually not balanced, i.e. it is a bond between a light and a heavy part. Once a polymer with a balanced molecule is fabricated, the IR transmission increases (see FIG. 8C).

If the Electret is a Thermo-Electret:

Depending on the electret material being used, several approaches may be applied for filling the voids between the oriented domains of the inorganic crystal material. For example, if the electret is a thermo-electret 30, it could be simply melted and solidified in the presence of a direct electric field 20. Such a process does not require any special environmental conditions or the use of expensive equipment. It can be performed in atmospheric air, at atmospheric pressure and at relatively low temperatures, which are usually between 100-300° C., depending on the thermo-electret melting point. The already-furrowed inorganic crystal semiconductor sample 24 may be placed on a small Peltier element 26 (see FIG. 10A) with the furrowed surface up. A small solid flat piece of the thermo-electret 30 with a surface about equal to the top surface of the semiconductor sample 24 is placed on top of the inorganic semiconductor matrix 24 (FIG. 10A).

This three-piece "sandwich" (Peltier element 26, inorganic crystal matrix 24 and thermo-electret sample 30) is placed between the flat electrodes 32, 34 of an air capacitor, powered by a high voltage source (not depicted). The electric field 20 applied in-situ may be arranged in a direction opposite to the natural polarization direction in the inorganic crystal material 24, which can be determined by the orientation in which the inorganic matrix has been furrowed (see FIGS. 2A and 3A-3C). The intensity of the electric field 20 may be correlated to the total polarization in the semiconductor inorganic material 24 (which can be easily calculated), roughly in the range of $10^5$-$10^6$ V/m. The polarization Pin a polar electret will be obtained through alignment of the polar groups within the applied electrical field at elevated temperature and can be expressed by the Debye equation:

$$\frac{dP(t)}{dt} + \alpha_T P(t) = \varepsilon_0(\varepsilon_S - \varepsilon_\infty)\alpha_T E \quad (1)$$

where $\alpha_T$, $\varepsilon_S$ and $\varepsilon_\infty$ are the single-dipole relaxation frequency, the static and the optical dielectric constant, respectively.

As the electrical field 20 is applied, the Peltier element 26 is powered to start heating the inorganic material 24 (other heating approaches are also possible), which conducts the heat to the solid thermo-electret 30 on its top until the electret 30 entirely melts (FIG. 10B) and molten electret material 30 fills the slits in the hot semiconductor material 24 to the very top (see FIG. 10C). Another option is to use an IR source to heat the electret 30. Once the thermo-electret 30 has filled the slits in the semiconductor 24 the polarity of the Peltier element 26 is switched in order to start cooling the "sandwich". Optionally, the Peltier element 26 may be simply turned off to let the "sandwich" cool down naturally. The electric field 20 must stay "on" until the thermo-electret 30 is fully solidified so that the polarization state is "frozen" inside the electret volume. One should remember that many electrets are also piezoelectric or ferroelectric materials, i.e. under a characteristic temperature, called Curie temperature (TC), they possess so-called spontaneous polarization. In such cases, applying an electrical field will be not necessary, except for the purpose to determine the direction of the spontaneous polarization, if necessary.

After turning off the electrical field 20 (FIG. 10D), the already-cooled inorganic crystal/electret hybrid structure can be taken out and any excess solidified thermo-electret material, which is not in the slits, may be carefully removed. In that way the hybrid QPM structure is ready for optical characterization and, eventually, incorporated into a frequency conversion device.

Figure 11A:
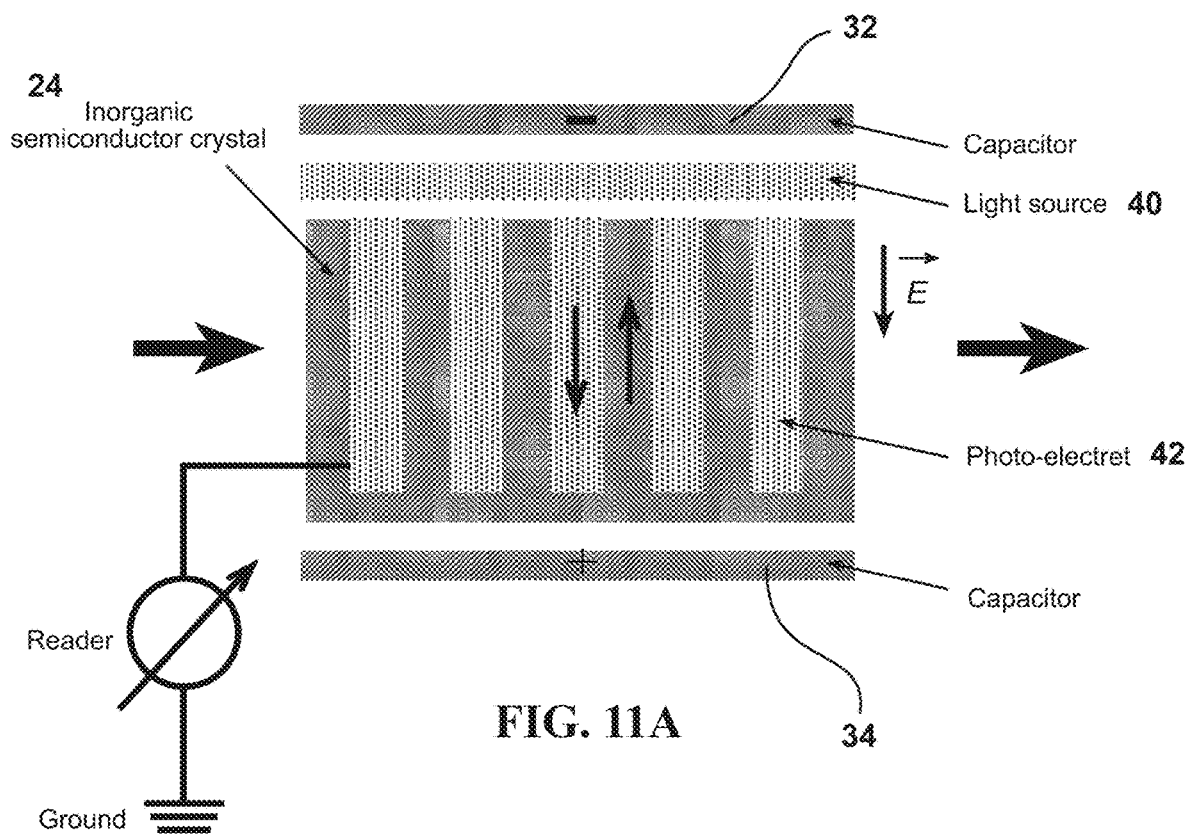
FIG. 11A depicts a schematic representation of the arrangement for preparation of an inorganic crystal/photo-electret structure.
Figure 11B:
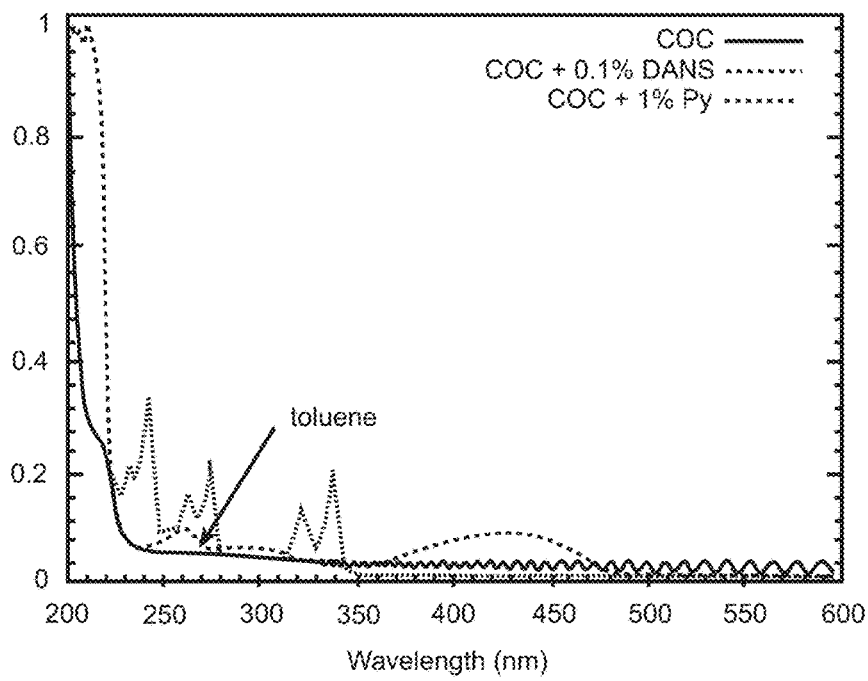
FIG. 11B depicts the absorption maximum of cyclic olefin copolymers (COC) at wavelengths <230 nm.

If the Electret is a Photo-Electret:

If the second half of the matrix is a photo-electret, which is already in position between the voids of the inorganic crystalline half (by melting and solidification, evaporation, etc.), the polarization procedure may be simpler (FIG. 11A). An electrical field may not require to polarize the material. Instead of the matrix being polarized in the presence of a direct electrical field, the photo-electret material may be polarized with an intensive light, e.g. monochromatic light, with a wavelength around the absorption peak of the material (FIG. 11B). This light will provoke the polarization of the photo-electret. The light polarizes the material, initiating the process of collecting and storing charges on the electret surface or/and within its volume. The electrical field is needed only to ensure that the polarization of the electret is about equal but opposite to the polarization of the inorganic crystal material.

The polarization exhibited in photo-electrets is typically steady, even with some increase of the temperature, if the sample is kept in the dark. Depolarization of photo-electrets is usually achieved by illuminating them, usually with a light having a wavelength close to the wavelength of the polarizing light. For many photo-electrets, for example, cyclic olefin copolymers (COC), the polarization wavelength is in the UV or in the near to UV-visible region. Thus, if the polarization light, for example, is at about 250 nm, the depolarization light must be somewhere around 350-400 nm. In all cases experiments with light with energy less than the bandgap energy have not resulted in a pronounceable polarization or depolarization effect. This means that if the pump beam in a frequency conversion device is in the IR region even high intensity illumination will not depolarize the QPM structure. Similarly, an electric field which is enough to polarize an electret, especially in a liquid phase, may have no effect on the polarization of a solid inorganic semiconductor crystal material. Accordingly, applying an electrical field is "safe" for the natural polarization of the inorganic semiconductor half of the QPM matrix.

Other Electret Materials:

Although we have focused mostly on only two types of electrets, thermo- and photo-electrets, due to the diverse nature of the electrets, many other "filling" and "polarization" approaches can be applied—each of these cannot be mentioned here, but each is appropriate. Only one more particular case will be described in detail, the case when the electret is a liquid crystal. In this case, the liquid crystal can be just "dropped" into the inorganic crystalline matrix (see FIG. 4C) and allowed to dry. The inorganic crystalline matrix plays the role of a vessel for the liquid crystal (this is similar to the arrangements depicted in FIGS. 5A-5C, 10C, 11A but without the need for the melted solution, capacitors, and Peltier devices depicted). If the wetting of the inorganic crystal is a problem for the chosen materials, some surfactant may be used to "break" it, i.e. reduce the surface tension of the liquid crystal.

Because of the miniature size of the structure, it is possible for the QPM matrix to be placed within a Second Harmonic Generation (SHG) device and even in an OPO (Optical Parametric Oscillator) optical set, according to a third embodiment of the invention. Thus the whole polarization procedure may be directly performed in-situ, tuning the polarization by additional light "chargings" or/and partly electrical "dischargings" until achieving a maximal output.

Figure 12A:
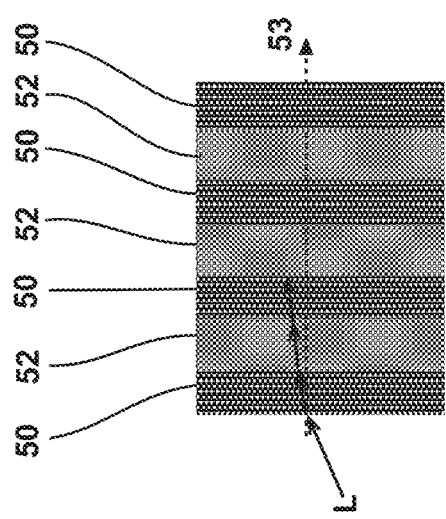
FIGS. 12A-12C depicts the focusing effect of the organic materials according to the selected refractive index of the materials.
Figure 12B:
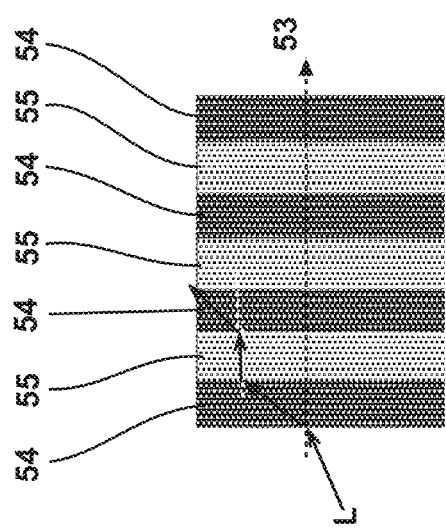
Figure 12C:
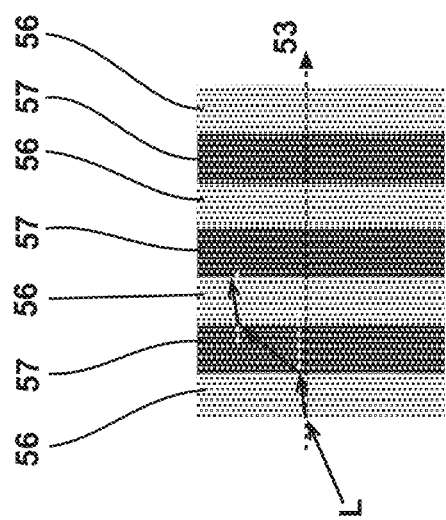

The nonlinear susceptibility of many electrets is significantly higher than the traditional nonlinear susceptibility of the inorganic semiconductor materials such as GaP, GaAs, ZnSe, GaN, etc. The refractive index of the electrets is usually smaller. This means that one can expect self-focusing of the beams propagating throughout the structure (FIGS. 12A-12C). FIGS. 12A-12C illustrate structures having alternating layers of inorganic materials and organic/electret materials, as described above in the various embodiments. FIG. 12 A illustrates an embodiment wherein the layered materials 50, 52 have the same refractive indices. 50 and 52 are, actually one and the same material but the orientations (the polarities) of the neighboring atoms are opposite. Accordingly, once the light energy (L) enters the first layer of material 50 the direction of the light does not change as it travels through subsequent layers 50, 52. If the light L is on a path which deviates from the centerline 53 in the first material layer 50, then it will continue on that deviating path through subsequent layers 52, 50, as illustrated in FIG. 12A. FIG. 12B illustrates an embodiment wherein the materials 54, 55 have dissimilar refractive indices, with material 55 having a lower refractive index than material 54. Accordingly, if the light energy (L) enters the first layer of material 54 at an angle which deviates from centerline 53, the direction of the light L will change to an angle which is further away from the centerline 53 as it travels through subsequent layers 55, 54. FIG. 12C illustrates an embodiment wherein the materials 56, 57 have dissimilar refractive indices, with material 57 having a higher refractive index than material 56. Accordingly, if the light energy (L) enters the first layer of material 56 at an angle which deviates from centerline 53, the direction of the light L may change to an angle which is not further away from the centerline 53 as it travels through subsequent layers 57, 56. Appropriate selection of the layered materials, their refractive indices, and the angle at which the light (L) traverses the material layers may aid in directing the light L through each material layer. When narrower domains are selected for the electret domains in comparison to the domains of the inorganic semiconductor crystal, which inorganic semiconductor typically has a higher thermal conductivity, the inorganic semiconductor will play the role of a heat sink for the electret half (cooling it down quickly) that is "nested" within the inorganic crystal half. Due to the smaller refractive index of the organic/polymer materials (Table 3), as well as their reciprocal dependencies on the wavelength and their higher nonlinear susceptibilities, the domains of such materials will be narrower than the inorganic semiconductor materials:

TABLE 3

Refractive indices for some typical polymer materials at different wavelengths (adapted from Table 1 in K. Clays et al., JOSA B 11(1994) 655) Refractive Indices for the Wavelengths Used, Sellmeier-Fit Parameters, and Film Thickness tf for Polystyrene and NLO Polymer Three-Layered Wave guides Used

| Wavelength (nm) | Polystyrene | Stilbene Polymer | Phenyl Polymer |
|---|---|---|---|
| 457.9 | 1.6046 (0.0003) | 1.6789 (0.0005) | 1.5750 (0.001) |
| 488.0 | 1.5986 (0.0002) | 1.6054 (0.0008) | 1.5660 (0.0003) |

TABLE 3-continued

Refractive indices for some typical polymer materials
at different wavelengths (adapted from Table 1 in K.
Clays et al., JOSA B 11(1994) 655)
Refractive Indices for the Wavelengths
Used, Sellmeier-Fit Parameters, and
Film Thickness tf for Polystyrene and NLO
Polymer Three-Layered Wave guides Used

| Wavelength (nm) | Polystyrene | Stilbene Polymer | Phenyl Polymer |
|---|---|---|---|
| 514.5 | 1.5942 (0.0003) | 1.6553 (0.0007) | 1.5599 (0.0001) |
| 632.8 | 1.5820 (0.0002) | 1.0306 (0.0002) | 1.5434 (0.0001) |
| 830.0 | 1.5120 (0.0002) | 1.6128 (0.0004) | 1.5818 (0.0001) |

Figure 13:
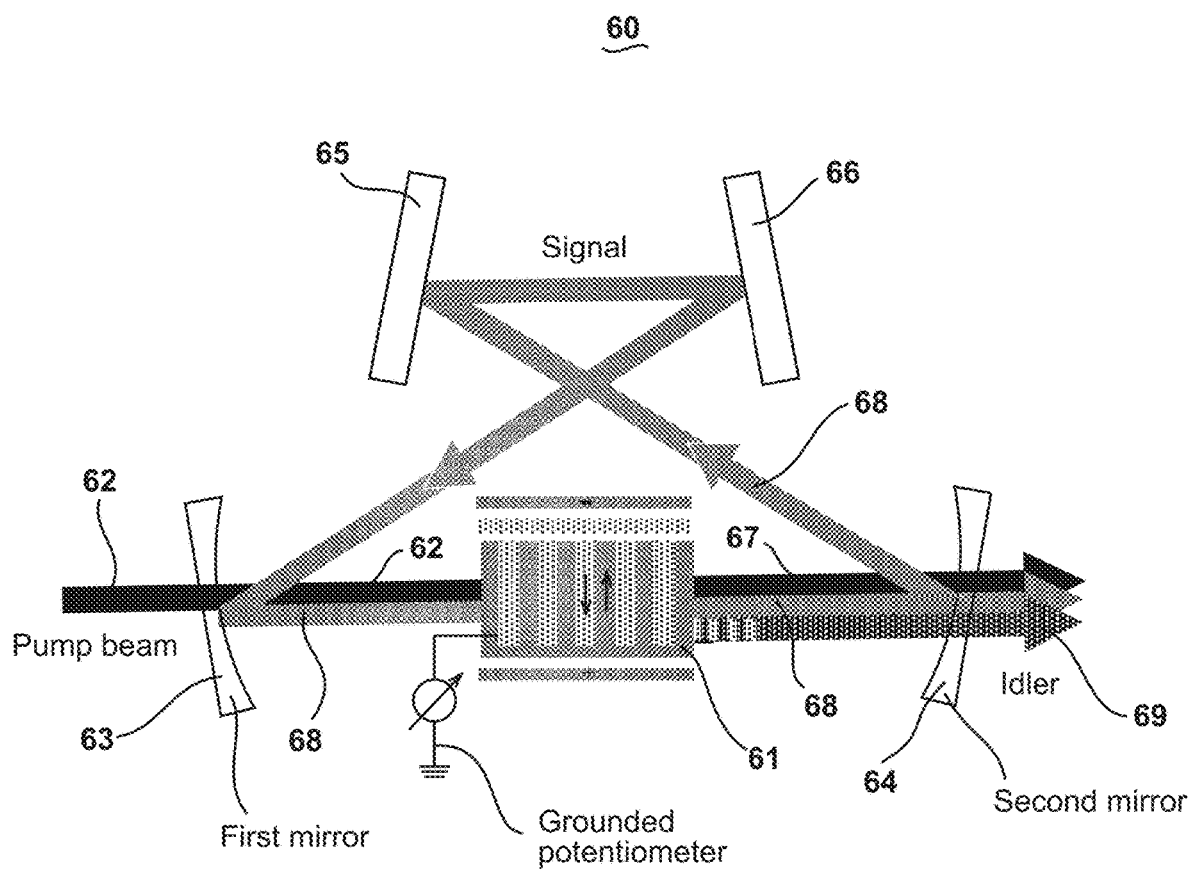
FIG. 13 depicts in-situ tuning of a crystal-electret hybrid QPM structure.

FIG. 13 illustrates an embodiment of an apparatus 60 incorporating the layered structure 61, according to one or more embodiments above. A pump beam 62 from a light source (not depicted) is directed through a first mirror 63 and through the layered structure 61. At least some of the pump beam 62 is processed in the layered structure 61 where it generates a polarization wave (beam) 68, i.e. signal or processed beam 68. In a wave-mixing process defined by the mirrors 63, 64, 65, 66, the two beams 62, 68 produce a derivative wave (beam), called an idler 69. This process of generating from one photon two other photons with different energies and wavelengths is accompanied by flowing energy from one wave to another. This process, however, strictly obeys the laws of conservation of energy and momentum. Accordingly, the total energy of the idler 69 and the polarization wave 68 (processed beam or signal) must be equal to the energy of the pump beam 62 that initially entered the OP structure 61. At least some of the pump beam 67, which has exited the layered structure 61, the processed beam 68 (signal) and the idler beam 69 pass through a second semi-transparent mirror 64 and exit the space between the first mirror 63 and the second mirror 64. In order to compensate the energy leaving the system, a part of the polarization wave 68 may be reflected by the second semi-transparent mirror 64, and with the help of a third mirror 65 and a fourth mirror 66, the polarization wave 68 is directed back into the layered structure 61 to resonate through the layered OP structure 61. Thus, the pump beam 62 may be used to continuously inject light into the apparatus, and the mirrors 63, 64, 65, 66 may be used to continuously feed the pump beam 62 and the processed beam 67 back into the structure 61. The light energy that does not exit the apparatus, e.g. via second mirror 64, may accumulate in the mirror loop, increasing in energy (amplifying) at the end of each loop, according to the quasi-phase matching concept.

Figures 14A, 14B, 14C:
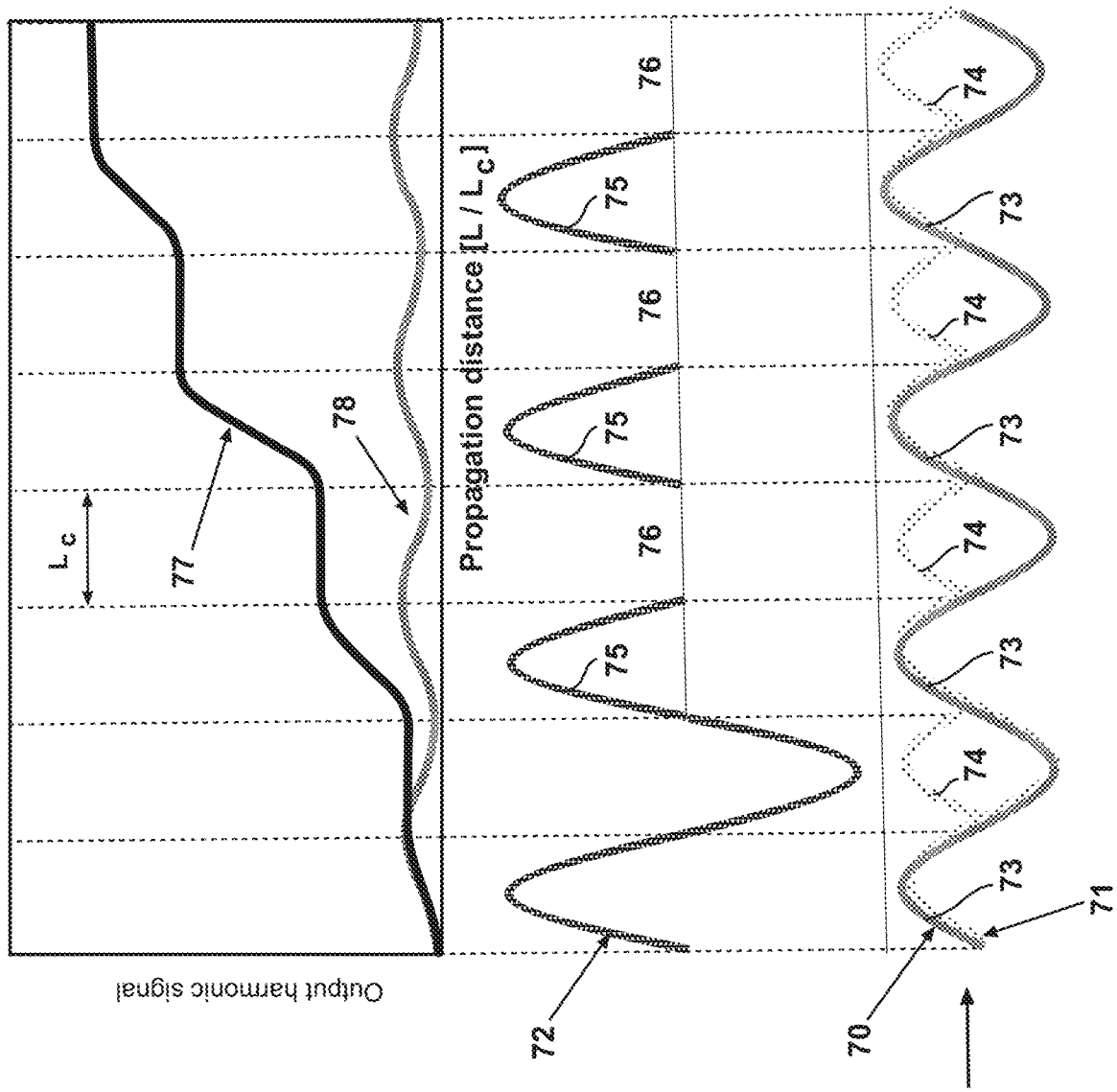
FIGS. 14A-14C illustrate the relationship between the input light energy and the polarizations of the structure according to quasi-phase-matching.

FIGS. 14A-14C illustrate schematically the wave characteristics for light energy processed through the apparatus of FIG. 13. The goal of the apparatus 60 is, in a wave-mixing process, to convert the original frequency of the pump beam 62 into a frequency in a range that is not available from any known direct laser sources. The pump beam 62 may be depicted as sine wave 70 (FIG. 14A). The pump beam 62 cannot be converted into another frequency without being processed in the layered structure 61. Without being processed, the average amplitude of the pump beam 62 is zero, because it is an unmodified sine wave 70, i.e. a wave that symmetrically oscillates around zero. When the pump beam 62/sine wave 70 enters a nonlinear medium, e.g. layered structure 61, it generates another sine wave, e.g. a polarization wave 68 or a processed wave 68 or signal (illustrated in FIG. 13 and as polarization wave 71 in FIG. 14A). As illustrated in FIG. 14A, polarization wave 71 has the same amplitude and is in-phase with the pump beam 62, sine wave 70. If the medium of the layered structure 61 is not a layered OP structure (explained above) the result from the wave interaction between waves 70 and 71 will be a sine wave too, as illustrated in FIG. 14B as wave 72. Sine wave 72 is also in-phase with waves 70 and 71 because its amplitude is a sum of the amplitudes of waves 70 and 71. In this case, the output signal after the propagation of wave 72 through a non-OP layered material will also be zero because it symmetrically oscillates around zero.

If the layered structure 61 is, however, a layered OP structure, i.e. a structure made of alternating layers of materials having different polarities, the wave-mixing may lead to a non-zero output signal. To satisfy the QPM conditions the polarity alternation in an OP structure (see FIG. 2C) may occur periodically at a distance/length called a characteristic length $L_c$, which is correlated to the width of one or each of the domains, the domains depicted in FIG. 2C as layers 18, 22, and in FIGS. 14A-14C as $L_c$. For example, the polarity alternation in the OP material, e.g. a structure 61 having alternating layers 18, 22, may occur at a distance that is equal to the half of the wavelength of waves 70, 71. Thus, by mechanically switching the polarity of the layers of the structure 61, the wave 71 will be forced to change its polarity at each π, as illustrated in FIG. 14A. That means when waves 70 and 71 are in their first, third, fifth, etc. halves 73 (which are above zero, i.e. positive), wave 72 will continue to be in-phase with them and its amplitude will continue to be a sum of their amplitudes 75. However, the second, fourth, sixth, etc. halves 74 will be in anti-phase and will cancel each other 76. As a result, wave 75 will be zero during these periods 74, which is a great advantage because it will not be negative and, thus, will not compensate/cancel its positive half 73. This means that wave 72 will have positive but not negative amplitude. Accordingly, wave 72 consists of a series of positive half-sine pulses 75 with a duration equal to the time of a half-wave light propagation, as depicted in FIG. 14B. This may allow the accumulation of the pulse energy to build-up a steady signal 77 from the output of the layered OP structure 61, as illustrated in the upper curve of FIG. 14C. The lower curve 77 of FIG. 14C illustrates an output signal from a non-OP structure, which results in zero accumulation of energy.

Figure 15A:
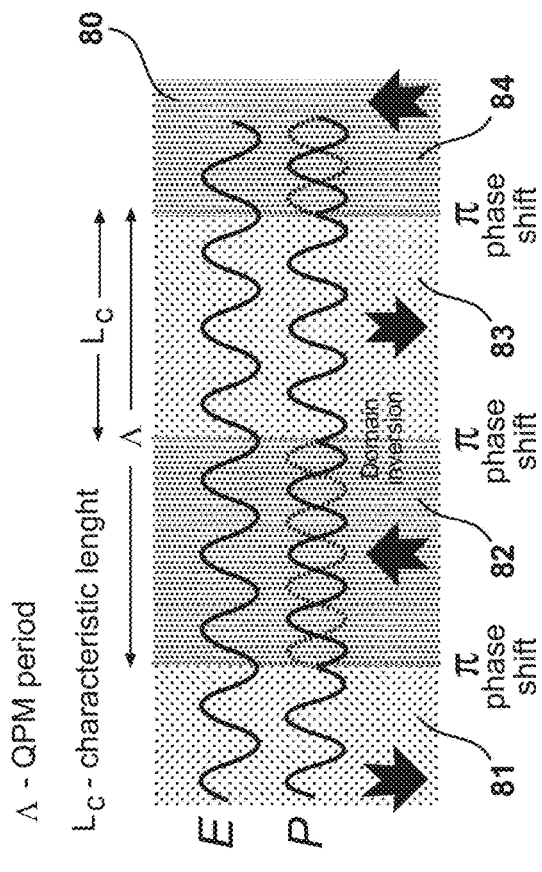
FIGS. 15A-15B illustrate QPM in relation to the alternating-polarity layers of the structure through which the waves travel.
Figure 15B:
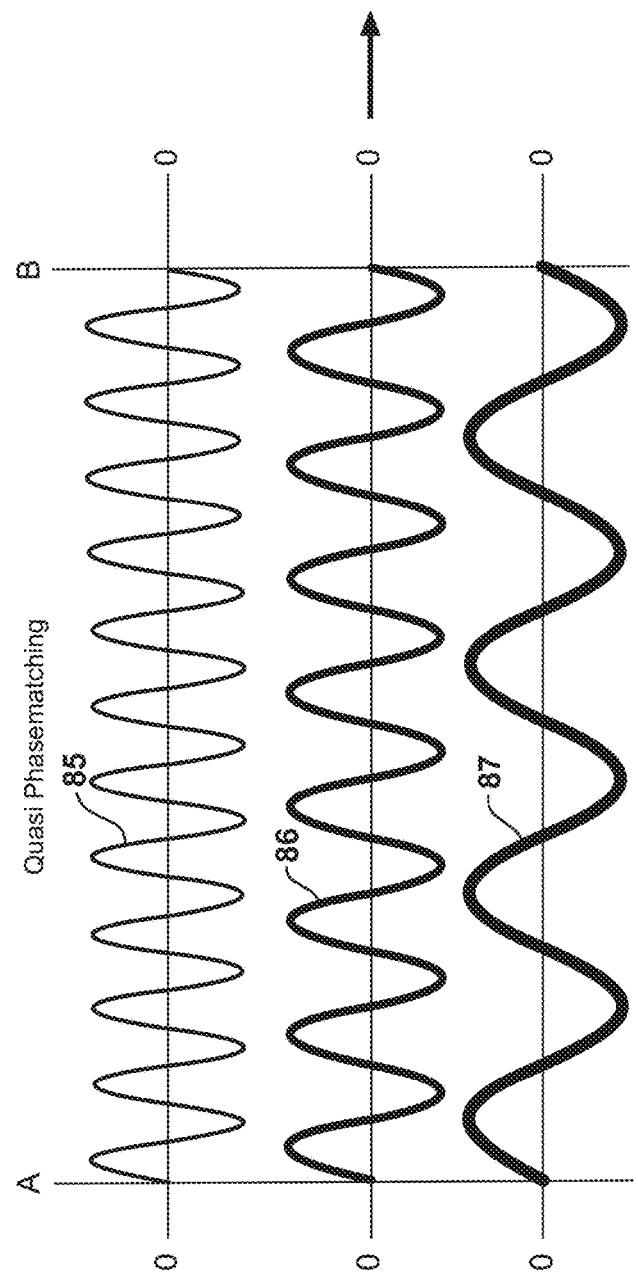

FIGS. 15A-15B present an illustrated explanation of QPM in relation to the alternating-polarity layers of the structure described above. The fabrication of OP-structures with domain widths equal to the half wavelength of the propagating light, while maintaining good domain fidelity at such small dimensions, is extremely difficult. Fortunately, this is not necessary, because to satisfy the QPM conditions the polarity alternation in an OP structure 80 (see also FIG. 2C) may occur periodically over distances much longer than the characteristic length $L_c$, as illustrated in FIG. 15A. FIG. 15A depicts a characteristic length $L_c$ which is equal to the width of one or each of the domains 81, 82, 83, 84 (which correspond to the domains depicted in FIG. 2C as layers 18, 22), and in FIGS. 14A-14C as $L_c$. Physically, $L_c$ is the length after which two waves that have been in one and the same phase once, e.g. both waves crossing "zero", coming from below at point A in FIG. 15B, could be in one and the same phase periodically again and again and again even when they have different wavelengths 85, 86, 87, as illustrated in FIG. 15B. The total width of two neighboring oppositely oriented domains 81, 82, 83, 84 is called period A of the pattern, as illustrated in FIG. 15A.

To clarify, the three different wavelengths 85, 86, 87 of FIG. 15B are not in phase. However, the three different wavelengths 85, 86, 87 are "in one and the same phase" on a periodic basis. By this is meant that the three waves 85-87 are in the same stage, e.g. crossing "zero" coming from below (see points A and B in FIG. 15B), or being in maximum or in minimum at the same time. The three waves 85-87 of FIG. 15B are in one and the same phase or stage both at point A and point B.

In summary, the proposed invention is an elegant solution that combines two materials which are completely different by their natures: a crystalline semiconductor inorganic material and an electret (or organic) material, both with high nonlinear susceptibility and good transparency, including IR and THz transparency. The two materials cleverly support each other in a manner that multiplies their pros and mutually compensates for their cons. As explained above, the low melting point of the electret is compensated by introducing the electret in an inorganic semiconductor "radiator" in a material matrix having thermal conductivity orders of magnitude higher than that of the electret material. The proposed approach, in our best knowledge, is the first process which is entirely free of any kind of growth procedures for preparation of QPM structures, and free of epitaxy.

The second embodiment of the invention is favored by recent advances in two different scientific areas—the semiconductor inorganic NLO materials and the NLO electrets (the electrets could be inorganic, semi-organic and organic; crystalline, polycrystalline or amorphous-polymers or glasses, as well semiconductors or dielectrics). The fabrication of the hybrid QPM structures for frequency conversion devices is divided into 2 parts: (i) growth and/or fabrication or machining of the semiconductor inorganic half of the structure, and (ii) fabrication and polarizing of the electret half of this QPM structure. Several optional growth-free techniques and combinations of inorganic semiconductor/electret materials are proposed and supported by the most typical examples. However, the proposed approaches are not restricted to these examples. Rather, it is universal, which means it can be applied to other combinations of inorganic semiconductor/electret materials that possess the needed nonlinear properties, namely high enough nonlinear susceptibility and good IR and/or THz transparency.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of making a quasi-phase-matching (QPM) structure comprising the steps of:
    (a) machining a pattern into a crystalline semiconductor substrate to define a plurality of voids, the crystalline semiconductor substrate having a first polarity;
    (b) filling the voids with an electret material having a second polarity; and
    (c) applying an electric field to the electret material to influence a magnitude and a direction of the second polarity of the electret material, wherein the second polarity of the electret material is different from the first polarity.

2. The method according to claim 1, further comprising: machining the semiconductor substrate pattern to include rectangular shapes forming columns having substantially parallel walls defining the voids.

3. The method according to claim 2, wherein the electret material is filled between the columns of the crystalline semiconductor substrate, and substantially filling the voids between the columns.

4. The method according to claim 3, wherein the pattern of voids forms a stripe pattern on the crystalline semiconductor substrate.

5. The method according to claim 3, wherein the crystalline semiconductor substrate and the electret material have high non-linear susceptibilities.

6. The method according to claim 1, wherein the crystalline semiconductor substrate and the electret material exhibit transparency in at least one of the visible, infrared (IR), and terahertz (THz) regions.

7. The method according to claim 1, further comprising: applying an homogenous electric field to the crystalline semiconductor substrate and the electret material in the voids to influence the second polarity of the electret material, wherein the second polarity of the electret material is opposite from the first polarity.

8. The method according to claim 1, wherein the electret material includes a photo-electret, a thermo-electret, and a liquid crystal.

9. The method according to claim 1, further comprising: applying the electric field with one of a second harmonic generator and an optical parametric oscillator.

10. The method according to claim 9, further comprising: placing the crystalline semiconductor substrate and electret material within one of the second harmonic generator and optical parametric oscillator.

11. A method of making a quasi-phase-matching (QPM) structure comprising the steps of:
    (a) applying a pattern to a substrate to define a plurality of growth regions and a plurality of voids;
    (b) growing a crystalline inorganic material on the growth regions in the pattern including voids between adjacent growth regions, the crystalline inorganic material having a first polarity;
    (c) filling the voids in the crystalline inorganic material with a crystalline organic material having a second polarity; and
    (d) applying an electrical field within a growth chamber containing the substrate with the crystalline inorganic material wherein the electric field reaches throughout the growth chamber in order to perform at least one of: (1) polarizing part of the crystalline organic material of the QPM structure opposite to the crystalline inorganic material in at least one of magnitude and direction; (2) equalizing magnitudes of the first and second polarities with opposite directions of the respective polarities; (3) controlling a direction of any spontaneous polarization of the crystalline organic material; or (4) adjusting the second polarity of the crystalline organic material.

12. A method of making a quasi-phase-matching (QPM) structure comprising the steps of:
    (a) applying a crystalline inorganic material on a substrate, the crystalline inorganic material having a first polarity;
    (b) forming voids in the crystalline inorganic material by at least one of sawing and laser machining;
    (c) filling the voids in the crystalline inorganic material with a crystalline organic material having a second polarity; and (d) applying an electrical field within a growth chamber containing the substrate with the crystalline inorganic material wherein the electric field reaches throughout the growth chamber in order to perform at least one of: (1) polarizing part of the crystalline organic material of the QPM structure opposite to the crystalline inorganic material in at least one of magnitude and direction; (2) equalizing magnitudes of the first and second polarities with opposite directions of the respective polarities; (3) controlling a direction of any spontaneous polarization of the crystalline organic material; or (4) adjusting the second polarity of the crystalline organic material.

\* \* \* \* \*